United States Patent [19]

Tsuya et al.

[11] Patent Number: 4,525,223
[45] Date of Patent: Jun. 25, 1985

[54] METHOD OF MANUFACTURING A THIN RIBBON WAFER OF SEMICONDUCTOR MATERIAL

[75] Inventors: Noboru Tsuya, 1-38, Kashiwagi 2-Chome, Sendai, Japan; Kenichi Arai, Sendai, Japan

[73] Assignee: Noboru Tsuya, Sendai, Japan

[21] Appl. No.: 597,565

[22] Filed: Apr. 9, 1984

Related U.S. Application Data

[63] Continuation of Ser. No. 375,314, May 5, 1982, abandoned, which is a continuation of Ser. No. 55,031, Jul. 6, 1979, abandoned.

[30] Foreign Application Priority Data

Sep. 19, 1978 [JP] Japan ............................... 53-114848
Oct. 12, 1978 [JP] Japan ............................... 53-125485

[51] Int. Cl.³ ......................................... H01L 21/208
[52] U.S. Cl. ........................................ 148/171; 148/1.5; 148/177; 156/603; 156/604; 264/177 F; 264/212; 427/85; 427/86; 428/620; 428/939
[58] Field of Search .................... 148/1.5, 171, 177; 156/603, 624; 264/177 F, 212; 428/620, 939; 427/85, 86

[56] References Cited

U.S. PATENT DOCUMENTS

| | | | |
|---|---|---|---|
| 1,756,196 | 4/1930 | Hopkins et al. | 164/87 |
| 1,867,818 | 7/1932 | Freeland | 148/111 |
| 2,364,642 | 12/1944 | Miller et al. | 264/104 |
| 2,825,108 | 3/1958 | Pond | 428/606 |
| 2,956,023 | 10/1960 | Fredrick et al. | 252/62.3 R |
| 3,241,009 | 3/1966 | Dewald et al. | 357/2 |
| 3,381,739 | 5/1968 | Hart | 164/64 |
| 3,445,554 | 5/1969 | Jerome | 264/56 |
| 3,545,967 | 12/1970 | Mandal | 75/134 |
| 3,663,767 | 5/1972 | Shimotori et al. | 148/104 X |
| 3,748,728 | 7/1973 | Watson | 29/599 |
| 3,837,827 | 9/1974 | Carruthers et al. | 65/30 |
| 3,856,513 | 12/1974 | Chen et al. | 75/124 X |
| 3,896,203 | 7/1975 | Maringer et al. | 264/165 |
| 4,000,014 | 12/1976 | Winter | 148/11.5 R |
| 4,049,522 | 9/1977 | Ainslie et al. | 204/192 M |
| 4,065,330 | 12/1977 | Matsumoto et al. | 148/31.55 |
| 4,079,430 | 3/1978 | Fujishima et al. | 360/126 |
| 4,146,391 | 3/1979 | Inoue et al. | 75/124 |
| 4,152,535 | 5/1979 | Deminet et al. | 148/1.5 X |
| 4,221,257 | 9/1980 | Narasimhan | 164/87 |
| 4,229,231 | 10/1980 | Witt et al. | 148/1.5 |
| 4,233,338 | 11/1980 | Ricard et al. | 148/171 X |
| 4,244,722 | 1/1981 | Tsuya et al. | 264/211 X |
| 4,265,682 | 5/1981 | Tsuya et al. | 148/31.55 X |
| 4,339,508 | 7/1982 | Tsuya et al. | 428/606 |
| 4,363,769 | 12/1982 | Tsuya et al. | 264/85 |

FOREIGN PATENT DOCUMENTS

138517 11/1930 Japan .

Primary Examiner—George T. Ozaki
Attorney, Agent, or Firm—Fleit, Jacobson, Cohn & Price

[57] ABSTRACT

A novel thin ribbon wafer of semiconductor having a polycrystalline structure composed of more than 50% of a grain having a grain size of more than 5 μm, a thickness of 5 to 200 μm, sufficient flexibility to be windable on a pipe having a diameter of 34 mm, malleability, and composed from p-type, i-type or n-type semiconductor material, and the composite clad of at least two elements thereof so as to form a p-n type junction. The composition of said semiconductor material consists of pure silicon or silicon with additional elements for improving the properties of a semiconductor; said additional element being at least one element in a proportion of less than 10 atomic % as compared to said silicon, said element selected from the group consisting of non-metallic elements such as hydrogen, phosphorus, sulfur and oxygen; semi-metallic elements such as boron, arsenic, tellurium, tin and selenium; metallic elements such as aluminum, gallium, indium, chromium, silver, iron and bismuth; and mixtures thereof with at least one element having smaller solubility limit than that of silicon. A method of manufacturing a thin ribbon wafer of composite clad of semiconductor material is also disclosed. Said flexible thin ribbon wafer of semiconductor is available for use as/or in a semiconductor electronic device.

29 Claims, 50 Drawing Figures

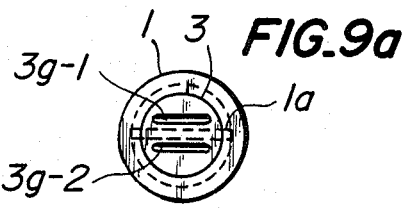
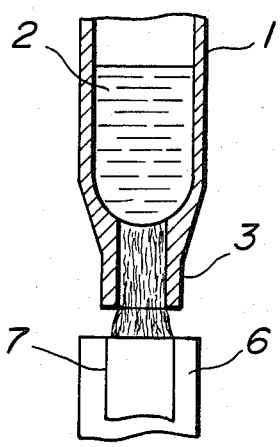
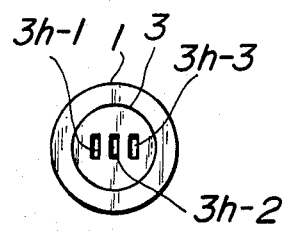
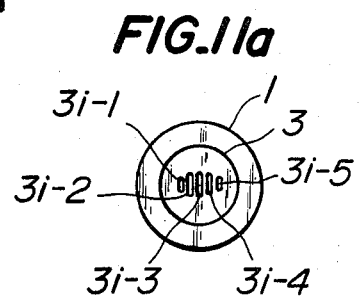
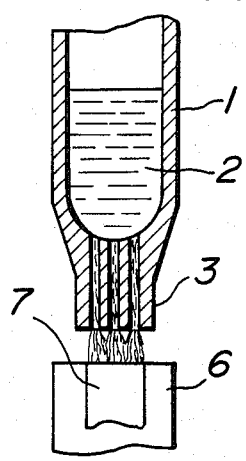
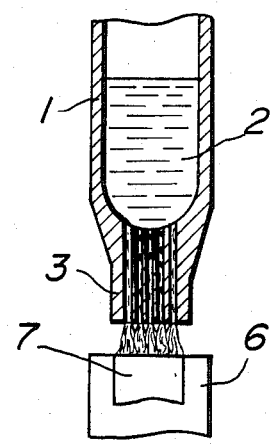

Free Surface of Silicon Ribbon (x150)
FIG. 27A  100 μm
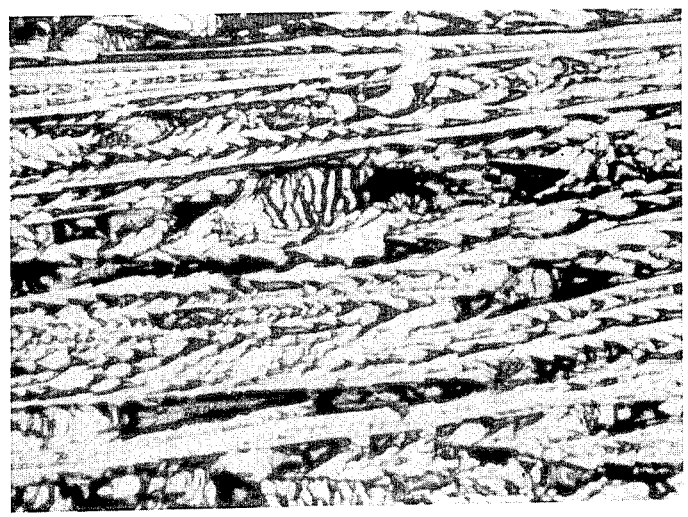
Rolled Surface of Silicon Ribbon (x150)
FIG. 27B  100 μm Spectral Distribution of Light
Absorptivity or Transmissivity
E(eV)

FIG. 33
FIG. 32
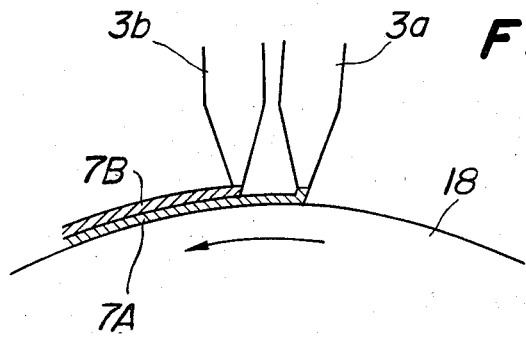
FIG. 34B
FIG. 34A 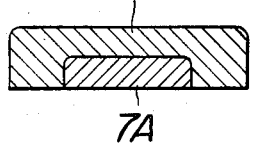 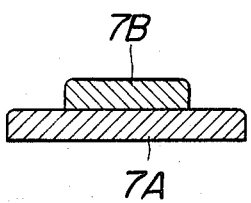 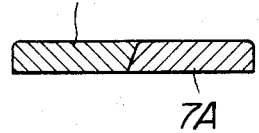 FIG. 34C
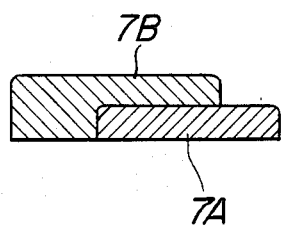 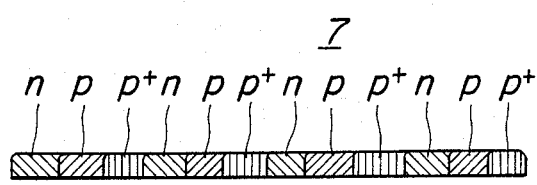
FIG. 34D  FIG. 34E

METHOD OF MANUFACTURING A THIN RIBBON WAFER OF SEMICONDUCTOR MATERIAL

This application is a continuation of application Ser. No. 375,314, filed May 5, 1982, which is a continuation application of Ser. No. 55,031 filed July 6, 1979, both now abandoned.

BACKGROUND OF THE INVENTION

1. Field of the Invention

This invention relates to a method of manufacturing a thin ribbon wafer of semiconductor material comprising preparing a material consisting essentially of pure silicon or silicon with less than 10 atomic % of at least one additional element selected from the group consisting of hydrogen, phosphorus, sulfur, oxygen, boron, arsenic, tellurium, tin, selenium, aluminum, gallium, indium, chromium, silver, iron and bismuth; by heating said semiconductor material to a melt; ejecting said melt through a nozzle under a pressure from 0.01 to 1.5 atm. onto a moving surface of a cooling substrate to cool said melt at a cooling rate of $10^3$–$10^6$°C./sec; forming a thin ribbon wafer of semiconductor material by separating it from said moving surface of cooling substrate; whereby the thus obtained thin ribbon wafer of semiconductor material has a polycrystalline structure composed of more than 50% of a grain having grain size of more than 5 μm, a thickness of 5–200 μm, a sufficient flexibility and is composed of at least two different type semiconductor materials selected from p-type, i-type and n-type.

2. Description of the Prior Art

The largest problem of semiconductor material in this field of science is how to mass produce thin ribbon wafers of silicon semiconductor less expensively while producing wafers having different substrates having different uses, such as in several semiconductor devices such as in solar cells, photoelectric transducers, etc. In the prior art, it is known that a thin ribbon wafer of single crystal silicon can be manufactured by an EFG method (edge-defined film-fed growth method), a lateral traction method, a capillary shaping method (capillary action shaping technique), an inverted Stepanov growth method, or a laser zone crystallization method for ribbon type crystal. It is also known that a thin sheet of silicon semiconductor in crystal form can be produced by a dip-coating method, a CVD method (chemical vapor deposition growth method), a CVD floating substrate growth method, or a hot-forming method for silicon, etc.

However, these methods are slower than that of the present invention, in the order of $10^2$–$10^3$, in the time of manufacturing a thin ribbon wafer. As the result, in terms of necessary electric power used in said production of a thin ribbon wafer of semiconductor, prior art methods were $10^2$–$10^3$ times more expensive.

Also the thus obtained prior art products were very brittle in the bending test and liable to be broken as compared with the present invention, and their workability for use as an electron device were consequently below the standards of the present invention.

SUMMARY OF THE INVENTION

The object of the present invention is to provide a cheap thin ribbon wafer of semiconductor having a sufficient flexibility and malleability and a method of manufacturing a thin ribbon wafer of semiconductor, wherein the thin ribbon wafer is manufactured at an ultra-high speed using super-rapid cooling; and to provide a cheap semiconductor device having a large surface of said silicon semiconductor.

One object of the present invention is to provide a method of manufacturing a cheap thin ribbon wafer of semiconductor having a sufficient flexibility over a large surface area so as to produce a thin ribbon wafer of semiconductor at a super-high speed and to provide a cheap semiconductor electron device having a large surface area with the use of said thin ribbon wafer of semiconductor.

The object of the present invention is to provide a thin ribbon wafer of semiconductor material made of pure silicon or silicon with additional element for improving their properties having of at least one element of less than 10 atomic % as compared to said silicon, selected from the group consisting of a non-metallic element such as hydrogen, phosphorus, sulfur and oxygen; a semi-metallic element such as boron, arsenic, tellurium, tin and selenium; a metallic element such as aluminum, gallium, indium, chromium, silver, iron and bismuth; and a mixture thereof with at least one element having smaller solubility limit than that of silicon; said thin ribbon wafer of semiconductor having a polycrystalline structure of grain size of 1–100 μm of more than 50%, a sufficient flexibility, a thickness of 5–200 μm and composed from p-type, i-type, n-type and the composite clad of at least two elements thereof.

Another object of the present invention is to provide a thin ribbon wafer of semiconductor material made of pure silicon or silicon with additional element for improving the properties of said semiconductor, using at least one element of less than 10 atomic % as compared to said silicon, said element being selected from the group consisting of a non-metallic element such as hydrogen, phosphorus, sulfur and oxygen; a semi-metallic element such as boron, arsenic, tellurium, tin and selenium, silver, iron and bismuth; and mixtures thereof with at least one element having smaller solubility limit than that of silicon; wherein said thin ribbon wafer of semiconductor material has a polycrystalline structure of a grain size of more than 5 μm of more than 50% by heat treatment and a thickness of 5–200 μm, a sufficient flexibility and composed from p-type, i-type, n-type and the composite clad of at least two elements thereof.

Further object of the present invention is to provide a method of manufacturing a thin ribbon wafer of semiconductor material essentially consisting of pure silicon or silicon with an additional element for improving the properties of the semiconductor using at least one element of less than 10 atomic % as compared to said silicon, said element being selected from the group consisting of a non-metallic element such as hydrogen, phosphorus, sulfur and oxygen; a semi-metallic element such as boron, arsenic, tellurium, tin and selenium; a metallic element such as aluminum, gallium, indium, chromium, silver, iron and bismuth; and a mixture thereof with at least one element having smaller solubility limit than that of silicon; wherein said semiconductor material is heated to a melt, said melt is ejected through a nozzle under a pressure against a moving surface of a cooling substrate which cools the semiconductor material super-rapidly at a cooling rate of $10^3$°–$10^6$° C./sec, whereby the thus obtained thin ribbon wafer of semiconductor material forms a polycrystalline structure having a grain size of more than 5 μm of more than 50%, a thickness of 5–200 μm, a sufficient flexibility, said wafer being composed from p-type, i-type, n-type semiconductor material, and the composite clad of at least two elements thereof.

A further object of the present invention is to provide a method of manufacturing a thin ribbon wafer of semiconductor material, essentially consisting of pure silicon or silicon with additional elements for improving the properties of the semiconductor, said additional element being at least one element of less than 10 atomic % as compared to said silicon, said element being selected from the group consisting of non-metallic elements such as hydrogen, phosphorus, sulfur and oxygen; semi-metallic elements such as boron, arsenic, tellurium, tin and selenium; metallic elements such as aluminum, gallium, indium, chromium, silver, iron and bismuth; and a semiconductor such as Ge, InSb, GaAs, BP, CdS, ZnSe, ZnTe, PbS or the like; and a mixture thereof with at least one element having smaller solubility limit than that of silicon; wherein said semiconductor material is heated to a melt, said melt is ejected through a nozzle under pressure against a cooling surface of a moving substrate to cool super-rapidly at a cooling rate of $10^{3°}$–$10^{6°}$ C./sec, whereby the thin ribbon wafer of semiconductor material is formed. The thus obtained thin ribbon wafer is heat-treated for more than 0.1 second at 500° to 1,500° C., whereby the thus obtained thin ribbon wafer of semiconductor material has a polycrystalline structure of a grain size of more than 5 μm of more than 50%, a thickness of 5 to 200 μm, a sufficient flexibility, and is composed from p-type, i-type, n-type semiconductor material and the composite clad of at least two elements.

A further object of the present invention is to provide a method of manufacturing a thin ribbon wafer of composite clad of semiconductor material selected from pure silicon or silicon with additional elements for improving their semiconductor properties having at least one element of less than 10 atomic % as compared to said silicon, said elements being from the group consisting of non-metallic elements such as hydrogen, phosphorus, sulfur and oxygen; semi-metallic elements such as boron, arsenic, tellurium, tin and selenium; metallic element such as aluminum, gallium, indium, chromium, silver, iron and bismuth; and a mixture thereof with at least one element having a smaller solubility limit than that of silicon, wherein said method comprises melting said semiconductor material to the melt; ejecting the melt through multiple holes of a single nozzle or several holes of multiple nozzles to the moving surface of cooling substrate; super-rapid cooling the melt on said moving surface of cooling substrate and forming a flexible thin ribbon wafer of semiconductor material having a thickness of 5–200 μm and composed of at least two layers of said semiconductor.

As moving cooling substrates, use is made of a drum, an endless belt and the like made of steel, stainless steel or aluminum, and the linear speed thereof is within the range of 5 m/sec–100 m/sec. In the case of a drum, its diameter is within the range of 4 cm–150 cm and its rotating speed is from 100 rpm to 20,000 rpm; it is necessary to select nozzle material, moving substrate material, dimension of the moving substrate, linear speed, ejecting pressure, ejecting temperature and several parameters depending on the type of material used in the ribbon. Each kind of thin ribbons, as will be explained later on, is formed in air, vacuum or inert atmosphere. It is preferable to keep a vacuum vessel for preparing thin ribbon in high vacuum of $10^{-8}$ Torr. In the case that there is the possibility of oxidizing in air such as Al, rare earth elements and the like, it is advantageous to produce the thin ribbon in vacuum or inert atmosphere. In order to produce a thin ribbon from oxide which prefers an oxidizing atmosphere, such atmosphere can advantageously simply be formed. In order to form a particularly flexible thin ribbon, a low gas pressure or vacuum is remarkably effective because the mechanical breakdown of ejected thin ribbon can be avoided.

The above described air exhaustion or atmosphere adjustment is carried out through a pipe path 16. Further, a raw material supply hole 17 may be provided, for the purpose of continuously producing thin ribbons as shown in FIG. 2.

As a nozzle hole, a round hole is the simplest, but as the process proceeds on a thin ribbon having a wide width, a laterally wide flat hole or elliptical hole is used. This method, however, is limited, such that the working of this hole shape of nozzle rapidly becomes difficult as the increase of width and the object of enlarging a width of thin ribbon cannot be attained.

When the physical property of a melt such as wettability or viscosity is suitably adjusted, if a plurality of properly shaped ejection holes of nozzle are closely aligned in a row, and each independent jet flow of one or more than two melts is integrated into one body, there is no limit of a ribbon width, and a thin ribbon having a wide width construction can be obtained. A distance between the top end of a nozzle hole and a cooling substrate is adjusted between 0.3–10 mm. Further, an angle between the surface of the cooling substrate and the direction of the jet flow can be varied over the wide range close to parallel from vertical.

The thin ribbon thus obtained by the method according to the present invention has a width of 1–7 mm, but if a plurality of nozzle holes are used, a thin ribbon having a greater width such as 30 mm can easily be obtained.

The thickness of the thin ribbon obtained by the above method is several μm to 200 μm, which fully covers a thickness of 20–30 μm which is most suitable for devices such as solar cells or the like and can be wound around a rotary pipe having a diameter of 34 mm without any damage. These characteristics with respect to width, flexibility or the like are far beyond the range anticipated from that of the thin ribbon manufactured by the other prior methods. Further, this thin ribbon is not amorphous but has a particular polycrystalline structure and is composed of crystal grains which are 1–100 μm before heat treatment, and about more than 5 μm after heat treatment; its electric resistance can be controlled by addition of impurities. It is possible to manufacture, from a thin ribbon having low resistance such as about 0.01 Ωcm highly resistant p-type, i-type (genuine) and n-type semiconductors which can be regarded as insulators.

Further, as a melt, it is possible to manufacture a thin ribbon over a wide range from pure silicon having a purity of about $10^{-8}$ to silicon added with less than 10% by atomic % of at least one element selected from the group consisting of hydrogen, phosphorus, sulfur, oxygen, boron, arsenic, tellurium, tin, selenium, aluminum, gallium, indium, chromium, silver, and bismuth.

A cross-sectional area of the thus obtained thin ribbon is almost uniform in the longitudinal direction, but ripple-like undulations are observed on the surface of the thin ribbon. An optical current caused by optical irradiation can be generated as well as in the case of silicon single crystals. According to an Auger spectral crystal, a certain kind of thin ribbons, a silicon oxide layer is grown on the surface of the thin ribbon in the order of 100 Å which is clearly distinguished from the internal material. It is possible to provide a metallic electrode having a resistive contact on the surface of a thin ribbon and it is also possible to provide rectification by applying a proper treatment on the surface layer. Further, the light absorption spectrum shows that the thin ribbon according to the present invention exhibits an intermediate phase between the single crystal and the amorphous material and gets close to the single crystal side by a proper treatment such as a heat treatment.

Upon the analytical study, the present inventors found the fact that the super-rapid cooling should be applied at a rate of less than $10^{6°}$ C./sec but more than $10^{3°}$ C./sec so as to obtain a compact, polycrystalline columnar structure perpendicular to the ribbon surface distributed without the ordered lattice.

After repeating tests, the inventors found the fact that it is very important to select a suitable measure from the following conditions.

(1) The cooling speed of the melt is preferably selected from $10^{3°}$–$10^{6°}$ C./sec.

(2) The melting temperature of the melt should be determined to a suitable temperature not exceeding 300° C. above the melting point considering with respect to the diameter of nozzle hole and the ejecting pressure.

(3) The viscosity of the melt should be adjusted to a preferable range of $5.5 \times 10^{-2} \sim 3 \times 10^{-2}$ dyne·sec/cm$^2$ by determining a suitable melting temperature of the melt.

(4) The ejecting pressure of the melt should be selected from a suitable range of 0.01–1.5 atm.

(5) The cooling substrate should be selected from among substrates having good wettability for the melt.

(6) The cooling substrate is preferably held at a temperature between room temperature and 400° C., and is kept in a vacuum, inert gas atmosphere or air.

(7) The moving or rotating speed may be preferably adjusted in a high speed so as to adjust the cooling speed of $10^{3°}$–$10^{6°}$ C./sec and to obtain a thin ribbon having a compact polycrystalline structure, by super-rapid cooling on the moving or rotating surface of a cooling substrate, while adhering on the surface of the cooling substrate.

It is very important to select the material of cooling substrate depending upon the semiconductor material to be used, by taking into account the wettability between the melt of semiconductor material and the cooling substrate. The wettability is mainly determined by surface tensions of the melt and the substrate.

The viscosity of the melt is selected from a suitable range to ensure the good characteristics of spreading the melt without bounding upon the cooling substrate when the melt is ejected through the nozzle. When the melt temperature is too high, more than 300° C. above the melting point, the melt might spread over the moving surface of the cooling substrate so that the ribbon wafer becomes too thin, and some times a greatly notched ribbon similar to a rattan blind might be produced, while when the temperature of melt is too low, the jet flow of the melt is not spread and is separated into a number of small particles having irregular configuration. According to the invention, it is preferable to select such a viscosity of the melt that edges of the melt are made in contact with the substrate at an angle from 10° to 170° with respect to the substrate surface. For this purpose, a temperature of the melt should be selected within the range from the melting point to 400° C. above the melting point, particularly 100° C. to 150° C. above the melting point.

It is also very important that the melt of semiconductor material should be instantaneously super-rapidly cooled on the moving surface of cooling substrate at a suitable cooling rate of at least 1,000° C./sec, preferably 1,000° to 1,000,000° C./sec by taking account of wettability between the melt of semiconductor material and the cooling substrate.

According to the invention, it has been found that the pressure under which the melt is ejected through the nozzle should be within the range of 0.01–1.5 atm.

If the ejecting pressure of the melt is too high, a melt would be scattered as a mist or fine particles having irregular configuration or the resultant ribbon may become greatly notched similar to a rattan blind.

The ejection of the melt is preferably effected in vacuum but it may be carried out in an inert gas, reducing gas atmosphere or air. Even in the latter case, it is preferable to reduce the pressure.

The material of the moving or rotating surface of cooling substrate, at least contacting the surface of the ejected melt may be at least one element selected from the group consisting of copper, copper alloy such as beryllium copper alloy, aluminum, aluminum alloy, titanium alloy, steel, alloy steel such as stainless steel, fused silica, fused alumina, etc. by taking account of the composition of the melt and wettability. The melt, having the composition of a thin ribbon of semiconductor material according to the present invention has better wettability in the case where a cooling substrate made of steel, alloy steel and aluminum or aluminum alloy is used as compared to a cooling substrate made of copper or copper alloy, and provides super-rapid cooling of the melt in a short time. For the above reason, it is very important that the material of the cooling substrate should be selected by considering the wettability between the melt and the cooling substrate.

It is very important in the manufacture of a thin ribbon of semiconductor material according to the present invention that the raw material should be maintained at high purity, that each condition for manufacturing a thin ribbon is suitably selected with respect to material, structure of nozzle and cooling substrate, more specially, it is also important to use a cooling substrate and to select a mutual pressure applied to the rolls and the roll space, and to select a speed and temperature of the rolls of suitable conditions, whereby the size of the thus obtained thin ribbon becomes large and high flexibility can be obtained, apparent specific gravity should be considerably close to the real specific gravity and high size precision should be maintained.

In this connection, if a temperature of the cooling substrate is maintained uniformly too low in the whole region of producing the thin ribbon in the widthwise direction, the high size precision of the thin ribbon cannot be obtained. To avoid this fault, the temperature of the cooling substrate in the portion producing the thin ribbon should be maintained up to 400° C. above room temperature by heating. It is a very important factor to improve their configuration and mechanical properties such as strength and workability.

For instance, in case of using a disc as a cooling substrate, if the condition of producing a thin ribbon is rather close to ideal conditions, the apparent specific gravity of the thin ribbon becomes low, so that high mechanical properties cannot be obtained.

When the temperature of the melt becomes too high, the viscosity is remarkably decreased. When these melts having low viscosity are ejected through a nozzle, the melt has a tendency to be in a spherical form because of surface tension. If the ejecting speed is too high, the melt cannot be formed into a continuous jet flow and is scattered as fine particles because of the collision with the air or because of a turbulent flow in the melt. Each particle is close to the spherical in form, and a scattered particle of a large size receives various forces during moving in the air and is greatly modified from the spherical form and rescattered, or particles are agglomerated with each other in some cases. In such a process, if a temperature of said melt is too high, a continuous steady jet flow of the melt cannot be obtained, so that the thus obtained thin ribbon contains unevennesses and its mechanical properties are diminished.

The other fault, in the case of the melting temperature being too high relates to the two phenomena that occur when the jet flow of melt strikes the surface of the cooling substrate. In the outset, if the temperature of melt is too much above the melting point during the collision with the cooling substrate, the jet flow of melt will be repelled from the surface of the cooling substrate and scattered as fine particles, and the thin ribbon cannot be formed. However, when the temperature of cooling substrate is maintained at a suitable temperature between room temperature and 400° C., the repelling does not occur, since the viscosity is maintained in a suitable range of $5.5 \times 10^{-2} \sim 3 \times 10^{-2}$ dyne·sec/cm², whereby the melt forms a thin ribbon.

Secondly, when the melt is super-rapidly cooled on the surface of the cooling substrate, the free surface of jet flow of melt is not parallel to the moving surface of cooling substrate. The surface wave is induced by the collision of the jet flow of the melt against the cooling substrate, and an unevenness of the thickness of thin ribbon partially occurs. If the temperature of jet flow of melt is suitably adjusted, the wettability in the contact surface between the melt and cooling substrate is suitably adjusted to fit the surface tension, whereby the surface wave does not result. Such is called a crystal dumping state. If it is in the crystal dumping state, a thin ribbon having a very high precision can be obtained. If the melt is super-rapidly cooled, in the state of oscillating a large frequency surface wave, and the contact angle between the jet flow of melt and the moving surface of the cooling substrate is excessively more than 90°, the solidified thin ribbon becomes as like a rattan blind.

It is very important that a flexible thin ribbon be durable against more pressure to breakage than that of brittle thin ribbon. This means that a great operation force can be applied against the thin ribbon in working.

It is important that the high mass producibility of thin ribbon for use as a semiconductor device can be expected.

It is further important that high separability for laminations in building semiconductor devices can be expected, and it is significant in that it enables a reduction in the manufacturing price.

The high flexibility of the thin ribbon is highly significant to its industrial value.

BRIEF DESCRIPTION OF THE DRAWINGS

The present invention will be explained in more detail referring to the accompanying drawings.

FIGS. 9a and 9b illustrate a plan view and sectional view of a nozzle having two laterally extended elliptical ejecting nozzle holes arranged in parallel direction for carrying out the present invention, respectively;

FIGS. 10a and 10b illustrate a plan view and sectional view of a nozzle having a plurality of longitudinally extended rectangular ejecting nozzle holes arranged in parallel direction for carrying out the present invention, respectively;

FIGS. 11a and 11b illustrate a plan view and sectional view of a nozzle having a plurality of three longitudinally extended elliptical ejecting holes arranged in parallel direction for carrying out the present invention, respectively;

FIGS. 27(A) and 27(B) illustrate microscopic photographs of the thus obtained thin ribbon wafer of semiconductor;

FIG. 32 illustrates a diagrammatical view showing the relative position between two nozzle holes and the moving surface of cooling substrate; and FIGS. 33(A), 33(B), 33(C), 33(D) and 33(E) illustrate a sectional view of the resultant composite thin ribbon wafer of semiconductor.

DESCRIPTION OF THE PREFERRED EMBODIMENTS

The present invention will be explained in more detail referring to the accompanying drawings.

Figure 1:
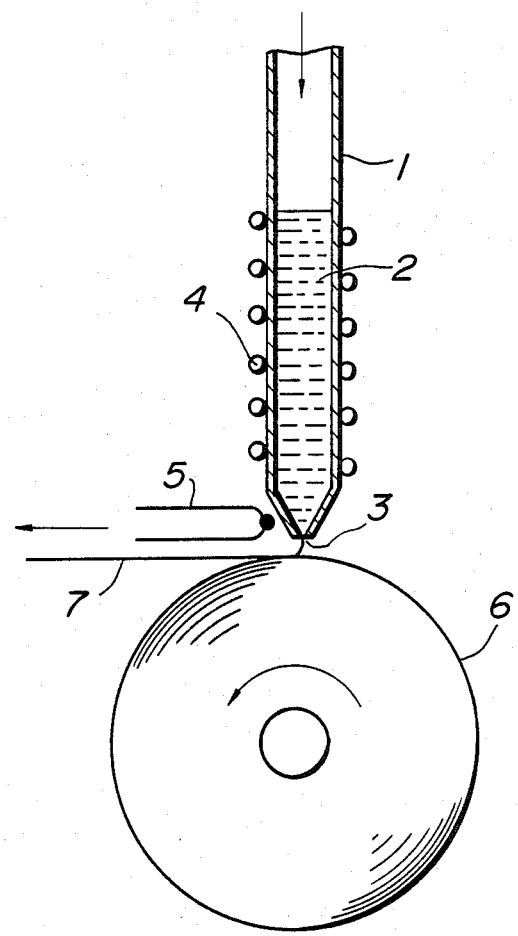
FIG. 1 is a fundamental diagrammatical view of an apparatus for manufacturing a thin ribbon wafer of semiconductor material according to the invention.

FIG. 1 is a diagrammatical view of an apparatus for manufacturing a thin ribbon wafer of silicon semiconductor material according to the present invention.

In FIG. 1, a reference numeral 1 designates a heat resisting tube, 2 is a melt of semiconductor material, 3 is a nozzle, 4 is a heater, 5 is a thermocouple, 6 is a moving or rotating cooling substrate, and 7 is a thin ribbon wafer of semiconductive material.

In FIG. 1, a melt of semiconductor material 2 essentially consisting of silicon is produced by heating in a heat resisting tube 1. The heat resisting tube 1 is, for instance, composed of a fused silica tube lined with boron nitride. The heat resisting tube 1 is provided with a nozzle 3 having a diameter of 0.1–0.5 mm at its free end. The melt of semiconductor material 2 in the heat resisting tube 1 is maintained at a temperature of 940°–980° C. by means of a heater 4. A cooling substrate 6 made of stainless steel is rotatably arranged below the heat resisting tube 1. The cooling substrate 6 is 300 mm in diameter and rotated at a speed of 100–2,500 rpm. The cooling substrate 6 is formed by a drum having a smooth and flat peripheral surface. The nozzle 3 is arranged close to the smooth and flat rotating surface of the drum 6. The melt of silicon in the heat resisting tube 1 is ejected onto the rotating surface through the nozzle 3 with adjustment of the ejecting pressure within a range of 0.03–1.5 atmospheric pressure. As soon as the melt of silicon contacts the rotating surface of the drum 6, the melt is super rapidly cooled on the rotating surface and a semiconductor thin ribbon wafer having a fine and compact polycrystalline structure is obtained in a continuous manner.

The thus obtained thin ribbon wafer of semiconductor is 5–30 μm in thickness and 0.1–0.8 mm in width. It was ascertained by an X-ray diffraction image that this thin ribbon wafer was substantially composed of a uniformly polycrystalline structure over the whole or in a substantial part.

Figure 2:
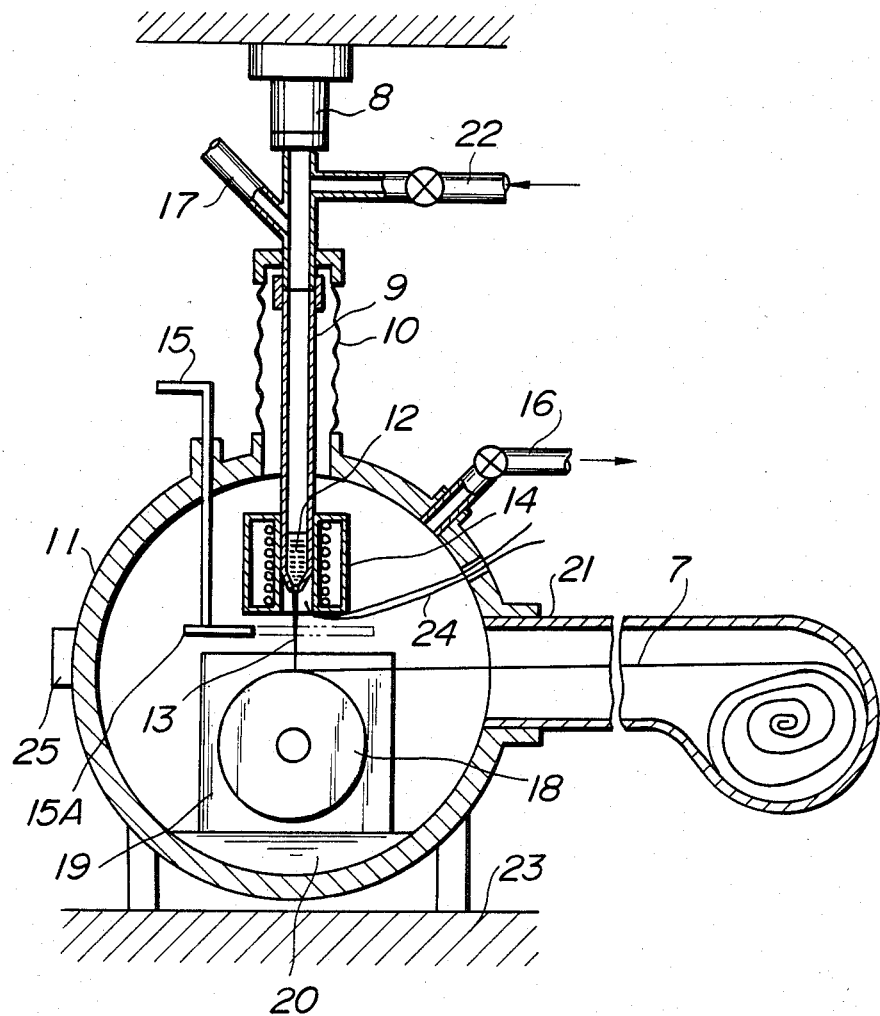
FIG. 2 is a sectional diagrammatical view showing experimental apparatus comprising a vacuum chamber.

Further, the thin ribbon wafer of silicon semiconductor was manufactured in vacuum with the use of a device shown in FIG. 2. In FIG. 2, a silicon material 12 is inserted into a heat resisting silica tube 9 and heated to a molten state at a temperature of 1,650° C. in an electric furnace 14. A temperature can be measured by a thermocouple 24. In this case, the vacuum chamber 11 placed on a base 23 is evacuated from an outlet 16 by a vacuum pump (not shown) and maintained at high vacuum of $10^{-4}$ Torr. The chamber is provided thereon with a terminal plate 25 and is further provided therein with a cooling device comprising a rotating cooling drum 18 made of copper having a diameter of 40 mm and a thickness of 10 mm secured to a variable speed motor 19, arranged on a support 20, whose speed varies 0–30,000 rpm. The pressure in the vacuum chamber 11 can be reduced within the range of $10^{-4}$–760 Torr, and the atmosphere can be replaced by nitrogen, argon gas and the like. Prior to ejecting the silicon melt 12, a shutter 15A is opened by a knob 15. The shutter 15A is closed before ejecting to prevent the drum 18 from being heated. Then, an electromagnetic value (not shown) is turned on to actuate a cylinder 8 so as to lower the tube 9 to a position immediately above the rotating drum 18 which is rotated at a speed of 0–30,000 rpm, and argon gas at 0.5 atmospheric pressure is forced into the tube through a gas inlet 22. The melt 13 of silicon is super rapidly cooled on a rotating substrate drum and is ejected away in a form of thin ribbon wafer and gathered together in a collecting port 21 for taking out after the completion of the ejecting. In this experimental device, it is possible to charge a raw material into an inlet 17 after the tube 9 has been heated. This device has an advantage in that any damage such as deformation or oxidation in the thin ribbon wafer due to collision with the fluid in the atmosphere resulting from the rapid formation of the thin ribbon wafer by the evacuation of vacuum chamber is considerably mitigated by reducing an atmospheric pressure, so that this device is very effective for obtaining long and wide thin ribbon wafers. In order to prevent an excessive oxidation, it is preferable to use an inert gas as the atmosphere at the reduced atmospheric pressure.

In FIG. 2, 10 is a bellows to seal the vacuum chamber 11 from the air, 15 is a knob and 15A is a shutter to shut off the cooling substrate drum 18 from the heat irradiation. The shutter 15A is rotated by the knob 15 around the shaft. The vacuum chamber 11 is supported by base 23. 24 is a thermocouple for electric furnance 14.

The thus obtained silicon thin ribbon wafer by super rapidly cooling the melt of silicon was 2.0 mm in width, 10 μm in thickness and more than 10 cm in length. The thin ribbon wafer was made into a thinner one of about 0.5 μm in thickness by etching, whose electron beam diffraction pattern was observed by a 1,000,000 V perspective electron microscope. As a result, it has been found that the thin wafer of silicon semiconductor was of a fine homogeneous crystalline texture.

In another embodiment, 0.5 of silicon, 0.05 of boron and 0.05 of phosphorus in atomic ratio were heated together in a molybdenum tube by means of a tungsten heater to form a melt and the melt was ejected onto a smooth and flat outer surface of a drum type rotating cooling substrate made of beryllium copper alloy 50 mm in diameter rotating at 2,000–20,000 rpm with the aid of argon gas at 0.03–1 atmospheric pressure through a nozzle having a diameter of 0.1–0.5 mm to obtain a thin ribbon wafer consisting of 0.5 silicon, 0.05 boron and 0.05 phosphorus in atomic ratio and having 10–40 $\mu$m in thickness and 0.2–1.0 mm in width. In this case, the whole device was put into the above vacuum chamber 11 which was maintained at 1 atmospheric pressure or $10^{-3}$ Torr. Further, the vacuum chamber was previously filled with argon gas and the pressure in the chamber was reduced. The non-oxidizing atmosphere is effective to prevent an oxidation of the surface of the thin ribbon wafer. Further, the effect of pressure reduction is remarkable in this embodiment. The damage such as deformations or creases due to the collision of the thin ribbon wafer with the gas is reduced due to vacuum or the reduced pressure, and as a result, a long thin ribbon wafer having a good quality becomes obtainable.

Besides the above properties, the characteristics of the thin ribbon wafer of semiconductor obtained by the method according to the invention will be explained as follows.

As to mechanical strength, if thin ribbon wafers having the same thickness and the same size are bent, its bending strength up to a fracture limit shows a high value of 2–3 times of those of semiconductors with a common crystalline texture. In other words, the mechanical strength of the thin ribbon wafer according to the invention becomes considerably higher.

As described above, according to the invention, a semiconductor thin ribbon wafer is obtained under the polycrystalline structure by ejecting a melt of semiconductor material through a nozzle and rapidly cooling it on the moving surface of a cooling substrate at a cooling rate of more than 3,000° C./sec up to 1,000,000° C./sec. The thus obtained thin ribbon wafer can be manufactured at a remarkably high speed as compared with the conventional method for manufacturing a conventional semiconductor wafer with the polycrystal texture and thus is very effective for use in such an apparatus that a great number of semiconductor elements are required.

The semiconductor thin ribbon wafer having the polycrystalline structure is usable as rectifiers, junction element by ion implantation, varistors, thermistors, memory elements, photoelectric elements, photocells, thermoelectric elements, electronic cooling elements, atomic cell elements and the like, and is remarkably valuable in industry.

The present invention can be carried out not only by a nozzle having a single nozzle hole, but also by a nozzle having multiple nozzle holes.

The embodiment with respect to the multiple nozzle according to the invention will be explained in detail with reference to the following embodiments illustrated in FIGS. 3–12.

A nozzle according to the present invention has not only a circular single hole shown in FIG. 3 nor a longitudinally extended elliptical hole shown in FIG. 4, but also a nozzle having two round holes aligned in FIG. 5.

Further, according to the invention, a thin ribbon wafer of semiconductor having large width is manufactured with the use of a laterally or longitudinally extended multiple hole nozzle arranged in parallel in lateral or longitudinal direction as shown in FIGS. 6, 7, 8, 9, 10, 11, and 12.

Figure 3A:
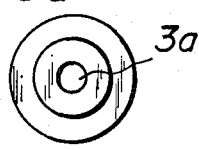
FIGS. 3a and 3b illustrate a plan view and sectional view of a heat resisting tube having a single round ejecting nozzle hole for carrying out the method of the present invention, respectively.
Figure 3B:
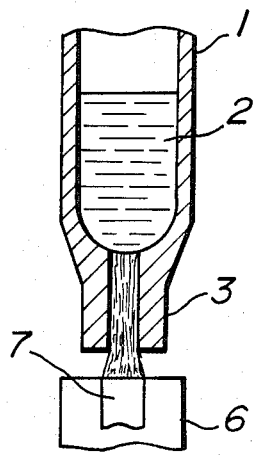

FIGS. 3a and 3b are bottom and cross sectional views showing a regular nozzle. This nozzle has a circular ejecting nozzle hole 3a having a diameter of 0.1–1 mm and its characteristic is to be capable of obtaining a thin ribbon wafer of semiconductor 7 having a width not smaller than the diameter even by ejecting a melt of semiconductor material having high viscosity through the nozzle hole.

Figure 4A:
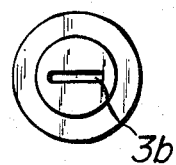
FIGS. 4a and 4b illustrate a plan view and sectional view of a nozzle having a laterally extended elliptical ejecting nozzle hole for carrying out the present invention, respectively.
Figure 4B:
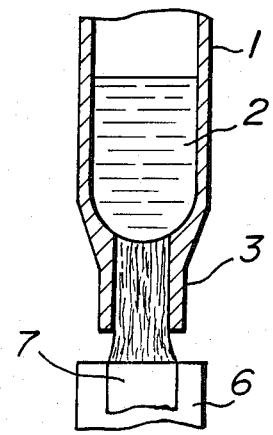

FIGS. 4a and 4b show a nozzle having an elliptical hole 3b. A characteristic of this nozzle is that the nozzle is suitable for manufacturing a thin ribbon wafer of semiconductor 7 having a comparatively large width.

Figure 5A:
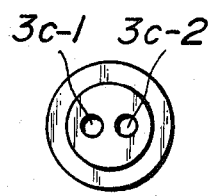
FIGS. 5a and 5b show a plan view and sectional view of a nozzle having two round holes arranged in a lateral direction for carrying out the present invention, respectively.
Figure 6A:
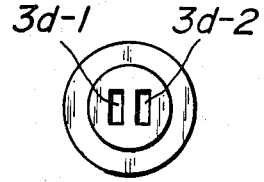
FIGS. 6a and 6b illustrate a plan view and sectional view of a nozzle having two rectangular ejecting nozzle holes arranged in a lateral direction for carrying out the present invention, respectively.
Figure 5B:
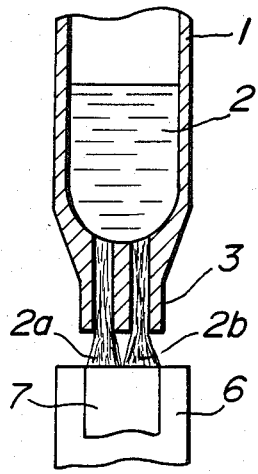
Figure 6B:
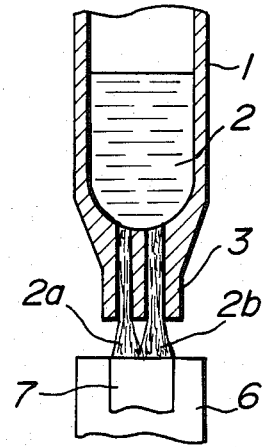

FIGS. 5a and 5b and FIGS. 6a and 6b show another embodiments of a nozzle 3 having two ejecting nozzle holes in a circular and rectangular form, respectively, aligned adjacent to each other in a lateral direction. FIGS. 5a and 5b show a nozzle 3 having two circular ejecting nozzle holes 3c-1, 3c-2 viewing from the end of nozzle, and FIGS. 6a and 6b show the nozzle 3 having two longitudinally extended rectangular holes 3d-1, 3d-2 arranged in parallel. A rotary axis of a rotating cooling substrate 6 is aligned in parallel to the direction for connecting the centers of these ejecting nozzle holes 3c-1 and 3c-2, 3d-1 and 3d-2, respectively. The principle for using this nozzle 3 is as follows. As described above, the width of a thin ribbon wafer of semiconductor is generally wider than that of the nozzle hole. That is, a closely ejected melt 2 is widened in diameter when impinged upon a rotating cooling substrate 6 from the ejecting nozzle hole of the nozzle 3. As shown in FIG. 5, if two ejecting nozzle holes 3c-1 and 3c-2 are closely aligned, two parallel jet flows 2a and 2b of melt are impinged upon the rotating cooling substrate 4 and amalgamated with each other thereon. As shown in FIG. 6, if the longitudinally extended rectangular ejecting nozzle holes 3d-1 and 3d-2 are closely aligned, the two parallel jet flows 2a and 2b of melt are closely aligned in the circular cross section by surface tension during flowing down and amalgamated around at the surface of rotating cooling substrate 6. In this manner, a thin ribbon wafer of semiconductor having a width substantially twice that of the image nozzle hole can be obtained. Semiconductor material thus obtained becomes a thin ribbon wafer of semiconductor having a large width. A size of the ejecting nozzle holes employed in this case is 0.6 mm in diameter and 70 mm$^2$ in nozzle hole area in the case shown in FIG. 5 and 1 mm in length, 0.5 mm in width and 60 mm$^2$ in nozzle hole area in the case shown in FIG. 6. In both cases, use is made of a fused silicate tube as nozzle material and the ejecting nozzle holes are manufactured by means of an ultrasonic processor. The above semiconductor material is molten at a temperature of 1,300° C. and cooled at super high speed by means of a rotating copper drum type substrate 6 under a pressure of 1 atm., a radius of 300 mm, a thickness of 10 mm, and a rotating speed of 2,000 rpm.

Figure 7A:
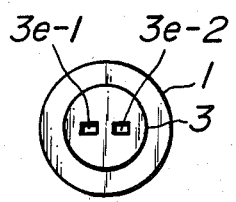
FIGS. 7a and 7b illustrate a plan view and sectional view of a nozzle having two laterally extended rectangular ejecting nozzle holes arranged in one direction, respectively.
Figure 8A:
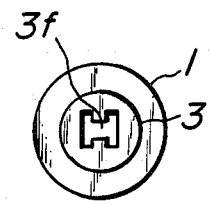
FIGS. 8a and 8b illustrate a plan view and sectional view of a nozzle having a H-shaped ejecting nozzle hole in a cross section for carrying out the present invention, respectively.
Figure 7B:
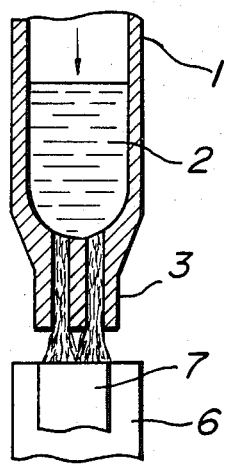
Figure 8B:
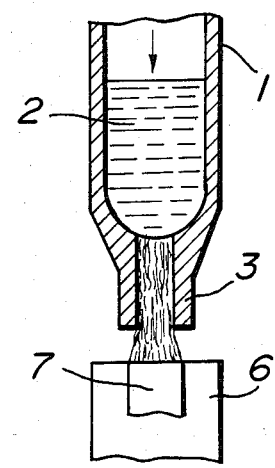

A nozzle 3 having two elongated nozzle holes 3e-1 and 3e-2 sufficiently close to each other as shown in FIGS. 7a and 7b is suitable for manufacturing a comparatively thin ribbon wafer. This nozzle 3 can be applied to the manufacture of a semiconductor thin ribbon wafer having a large width under the condition similar to that for manufacturing the thin ribbon wafer using the conventional single hole nozzle. In particular, a semiconductor thin ribbon wafer having a width of 7 mm was obtained by ejecting the melt heated at a temperature of 1,300° C. under 0.6 atmospheric pressure through the nozzle 3 made of fused quartz provided with two rectangular holes 3e-1 and 3e-2 of 0.6 mm in length and 3 mm in width spaced apart from each other by 50 μm and by rapidly cooling the melt by bringing it in contact with the rotating cooling drum type substrate 6. In case that the viscosity of the molten jet flow is low, if use is made of the nozzle 3 having the ejection nozzle hole 3f, in which a center portion of the partition for spacing two elongated square type ejection nozzle holes 3e-1 and 3e-2 is removed by 50–100 μm as shown in FIGS. 8a and 8b, a more preferable result can be obtained.

FIGS. 9a and 9b show another embodiment of the nozzle in which two elongated elliptical type ejection holes 3g-1 and 3g-2 are arranged side by side viewed in the direction of the rotation of the cooling substrate 6. Each of these nozzle holes is located in a chamber formed by a partition 1a for containing two kinds of semiconductor materials. When melts are ejected through these nozzle holes 3g-1 and 3g-2, it is possible to produce a double-layered thin ribbon wafer. In the embodiment of this nozzle, provision is made for two ejection nozzle holes being 0.2 mm in length and 0.7 mm in width vertically spaced apart from each other by 50 μm. With the use of this nozzle, germanium and silicon are separately charged into the nozzle chamber and separately made molten in the above two nozzle chambers at a temperature of 1,500° C. These two chambers communicated with a common pressure source for ejecting at a common atmospheric pressure of 0.7 and the melts rapidly cooled by ejecting onto said rotating cooling substrate 6 at a cooling rate of 1,000°–1,000,000° C./sec. Further, P-type silicon and N-type silicon are cooled under similar conditions with the use of this nozzle at a temperature of 1,500° C. and an atmospheric pressure of 0.5. The thus obtained thin ribbon wafer is of a double-layered structure being having about 0.8 mm in width and about 50 μm in thickness. In this manner it is possible to obtain a semiconductive thin ribbon wafer having a p-n junction.

FIGS. 10a and 10b illustrate another embodiment of the nozzle having three elliptical ejection nozzle holes 3h-1 to 3h-3. In this case, as far as three nozzle holes are not spaced apart from each other, a thin ribbon wafer three times wider than the width of the ejection nozzle holes can be obtained. That is, for example, three elliptical ejection nozzle holes having 1 mm in length and 0.7 mm in width are spaced apart from each other by 100 μm, the thin ribbon wafer having a width of 2.3 mm was produced. This embodiment is suitable for manufacturing a comparatively thick ribbon type thin wafer of semiconductor. If a space between the ejection nozzle holes is too wide, the multi-hole nozzles of the present embodiment and the preceding embodiments are not preferable, because creases might be formed in the finally obtained thin ribbon wafers. In case, except for the possible positive use of this crease, it is preferable to make a thickness of the partition between the ejection nozzle holes at least less than ⅓ of the longest size of the ejection nozzle hole, and it is more preferable to make the thickness 1/5 to 1/10. By using such a nozzle, the thin ribbon wafers of semiconductor having a desired width were obtained. However, if a thickness of the partition is too thin, such as less than 40 μm, the partition is easily broken.

FIGS. 11a and 11b show still another embodiment of the multiple hole type nozzle having five long elliptical ejection nozzle holes 3i-1 to 3i-5 laterally aligned in a row. With the aid of such a nozzle, a thin ribbon wafer of semiconductor having a width about 5 times larger than the diameter of the ejection nozzle hole is formed. The principle of this nozzle is as follows. For comparison, in the nozzle shown in FIG. 4a, a length of the laterally elongated elliptical ejection nozzle hole 3b is same as a total length of the ejection nozzle hole row of the nozzle shown in FIG. 11a. When the jet of the melt flows down through the wide elliptical nozzle hole 3b, the width of the molten jet flow becomes gradually narrower as it flows down and at the same time a thickness of the molten jet flow measured in a direction perpendicular to the width becomes thick. If the width of the molten jet flow becomes large, the defect might often occur at the center position or any other position of the thin ribbon wafer. It means that the molten jet flow does not uniformly flow down over the width but both side portions of the jet flow obliquely flow down toward the center, so that the jet flow is concentrated into the center portion. In the embodiment shown in FIG. 11, however, the ejection nozzle holes 3i-1 to 3i-5 are laterally aligned in a row, each jet flow flows down in parallel to each other, and all the jet flows are amalgamated on the surface of rotating cooling substrate 6. This principle is the same as the embodiments shown in FIGS. 5 and 6. The nozzle shown in FIG. 11 has the following specification as compared with the embodiment shown in FIG. 10. Three central holes 3i-2, 3i-3, 3i-4, form a main hole row and two slightly small sub-holes 3i-1 and 3i-5 on both sides of the main hole row have about 80% hole width as compared with three main holes for reducing an edge effect on both sides of the thin ribbon wafer. In one embodiment of the invention, the width of the main hole is 0.8 mm, the width of the sub-hole is 0.7 mm and the space of the ejection nozzle holes is 80 μm. The ejection holes of this embodiment can easily be formed with the aid of an ultrasonic machine. By rapidly cooling a silicon melt with the use of the present nozzle under the condition previously found by the inventors, thin ribbon wafers of silicon semiconductor having about 5 mm to 10 mm in width were obtained.

Figure 12A:
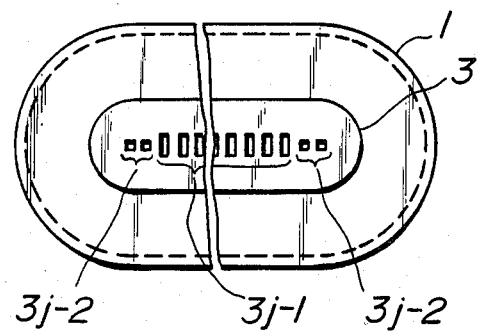
FIGS. 12a and 12b illustrate a plan view and sectional view of a nozzle having a plurality of longitudinally extended rectangular ejecting holes arranged in lateral direction and having a pair of sub-ejecting hole arranged in both outermost portions for carrying out the present invention, respectively.
Figure 12B:
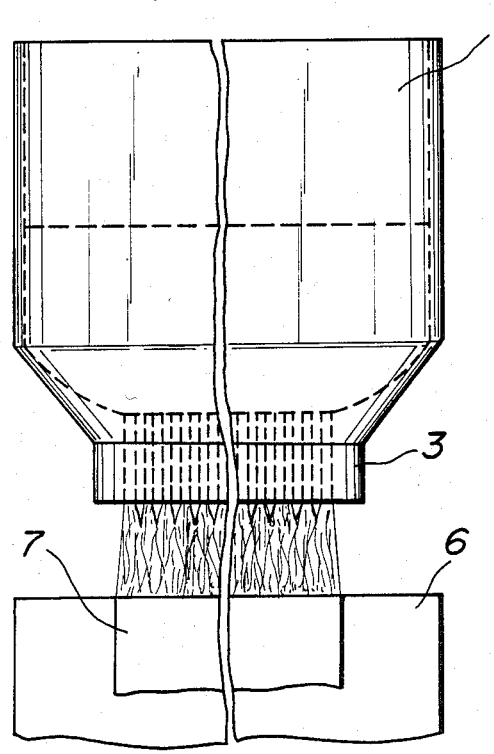

FIG. 12 shows a nozzle comprising a plurality of rectangular main holes 3j-1 and two auxiliary holes 3j-2 arranged on each side of main hole array for ignoring an edge effect to a great extent. According to this nozzle, a thin ribbon wafer of an optional width can be formed in principle. As the main nozzle hole 3j-1, use may be made of a merely rectangular hole, a long circular elliptical hole, and any shape which can uniformly combine said melt jet flows over the whole width of the wide thin ribbon wafer. With the aid of this nozzle, thin ribbon wafers of semiconductor having any desired width can be obtained.

As nozzle material, each kind of material can be selected in accordance with desired purposes. For example, fused quartz can be used over the range of 1,000° C. or more than that, i.e., several hundred degrees in celsius. As nozzle material, use is made of heat resisting ceramics such as $Al_2O_3$, MgO, beryllium oxide, etc. The nozzle made of such ceramics is preferably lined with boron nitride at a lower portion, particularly on an inner surface. In this case, semiconductor material can be molten at a high temperature. Particularly, a nozzle made of boron nitride has been found preferable for manufacturing the semiconductor thin ribbon wafer. Particularly, when a reduced atmosphere or vacuum is required, this nozzle material is effective and preferably available for a vacuum tank. The lining of the lower portion, particularly the inner surface of the nozzle lined with niobium nitride, is very effective for preventing a reaction of the melt with nozzle material.

The present invention is explained in detail in FIGS. 13 to 16 with respect to several embodiments of a melting apparatus with a nozzle having a water cooled nozzle hole.

Figure 13:
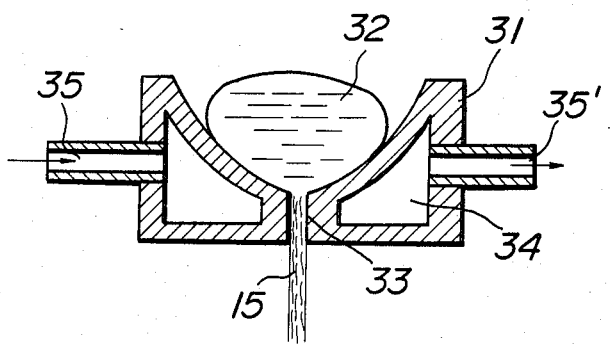
FIG. 13 shows a sectional view of a nozzle having cooling means according to the present invention.

In FIG. 13, numeral 31 designates a water cooled nozzle, 32 is a melt of semiconductor material, 33 is a nozzle hole disposed in a lower portion of the nozzle, 34 is a cooling water chamber surrounding said nozzle hole, and 35, 35' are inlet and outlet of said cooling water chamber. The melt 32 is ejected through nozzle hole 33 as a jet flow 15 toward a moving surface of cooling substrate.

(a) Melting apparatus by arc

Figure 14:
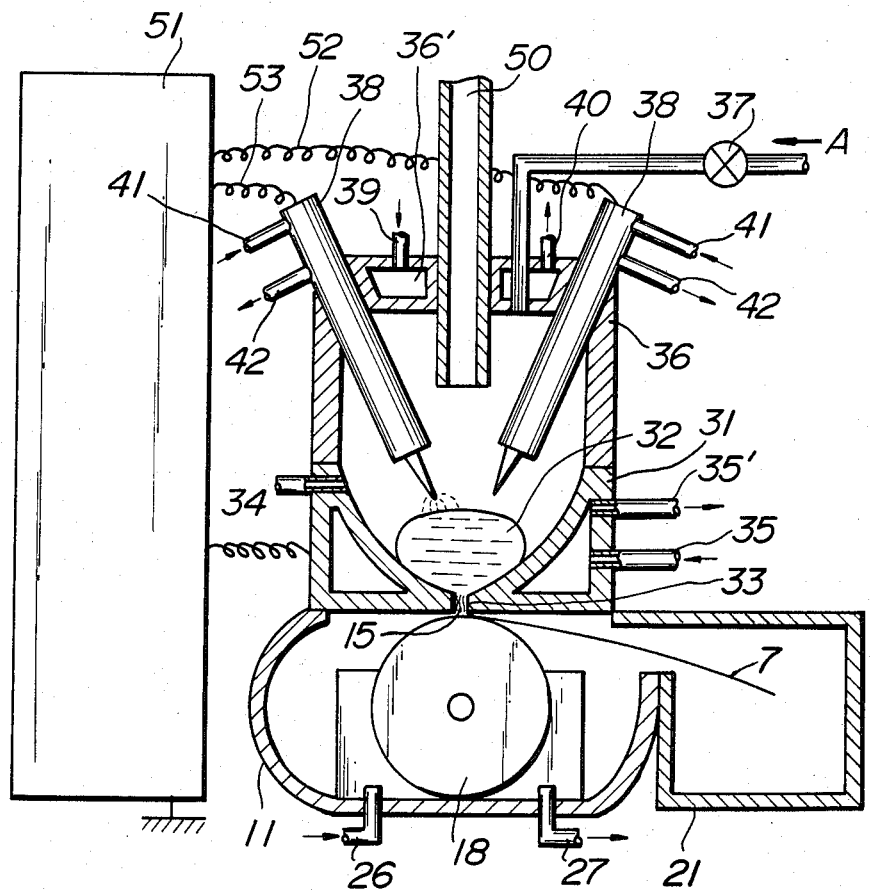
FIG. 14 shows a sectional view of a manufacturing apparatus of thin ribbon according to the present invention by using an arc heating device.

In case the thin ribbon material is conductive, the ejecting portion of water cooled nozzle 31 having an inlet 35 and outlet 35' is covered by heat insulating tube 36, and the raw material is charged into the insulating tube 36 through charging inlet 50 provided in the upper portion of said heat insulating tube 36. An inert gas such as argon is introduced to the said heat insulating tube 36 so as to provide an inert gas atmosphere. The raw material is heated by arc with the use of an electrode 38 made of tungsten and a melt 32 is formed. In FIG. 14, reference numerals 39, 40 are an inlet and an outlet of a cold medium for cooling the ceiling portion 36' of the heat insulating tube 36, respectively, while reference numerals 41, 42 are an inlet and an outlet of a cold medium for cooling an electrode 38, respectively. Reference numeral 51 is an electric source and 52 and 53 are electric conductors connecting to respective electrodes 38, 38. In the melting means of the apparatus according to the present invention, it is preferable to use an inert gas atmosphere so that the atmosphere does not contaminate the melt.

Reference numeral 18 is a rotating cooling substrate drum, 15 is a jet flow of melt, 11 is a vacuum tank, 26 and 27 are an inlet and an outlet of inert gas, and 7 is a thin ribbon wafer thus formed. In FIG. 14, 21 is a collecting port, 33 is a nozzle, and 34 is an inert gas outlet.

In the case that semiconductor material is molten in said arc furnace, if platinum or platinum-rhodium is used as an electrode, there is no possibility of entering electrode material into the melt of a semiconductor as impurities, but such electrode is expensive, so that carbon or tungsten is used as an expendable electrode, but if such electrode is used, carbon or tungsten is mixed into a semiconductor as impurities, possibly causing disadvantages.

In such a case, a laser electric power source is provided at the position of the electrode 38 instead of an arc electrode as a heat source, and a desired object can be attained.

(b) Melting means by high frequency induction

Figure 15:
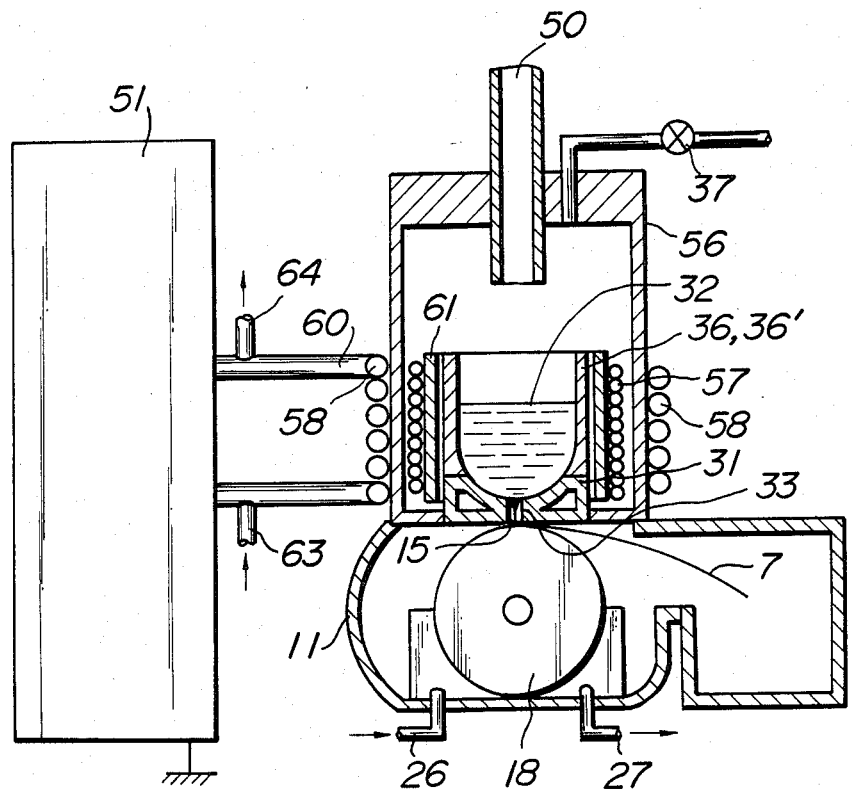
FIG. 15 shows a sectional view of a manufacturing apparatus of thin ribbon according to the present invention by using a high frequency induction heating means.

As shown in FIG. 15, a heat insulating tube 36 made of boron nitride or the like as a melting chamber is placed on the upper portion of an ejecting portion of nozzle 31 cooled by cold medium, and a coil 57 made of a copper pipe or the like is provided by surrounding the outside of said melting chamber 36, and the outside of said melting chamber 36 is covered with a heat insulating tube 61, and atmospheric gas flows into the melting chamber 36 made of insulating tube through a valve 37. The raw material is charged into the melting chamber 36 through an inlet 50. Thus, the raw material is heated and melted by transmitting a high frequency current to the coil 58 and a melt 32 can be obtained. In FIG. 15, reference numeral 51 is a high frequency electric source, and 63 and 64 are an inlet and an outlet of a coolant for cooling coils 58.

In the above high frequency induction heating device, if the raw material is an insulator, a platinum-rhodium tube 36' is connected to the upper portion of the cooled ejecting nozzle 31 instead of said insulating tube 36, and the raw material is charged therein, a high frequency current is transmitted into a high frequency coil 58 provided at the outside of said platinum-rhodium tube and said platinum-rhodium tube 36' is heated by high frequency induction, thereby a melt is obtained. In this case, if the melt is strongly intended to react with the platinum-rhodium tube 36', it is preferable to provide an inner tube made of boron nitride which scarcely reacts with said melt, and the charged raw material in the inner tube is heated by high frequency.

(c) Melting by burner

Figure 16:
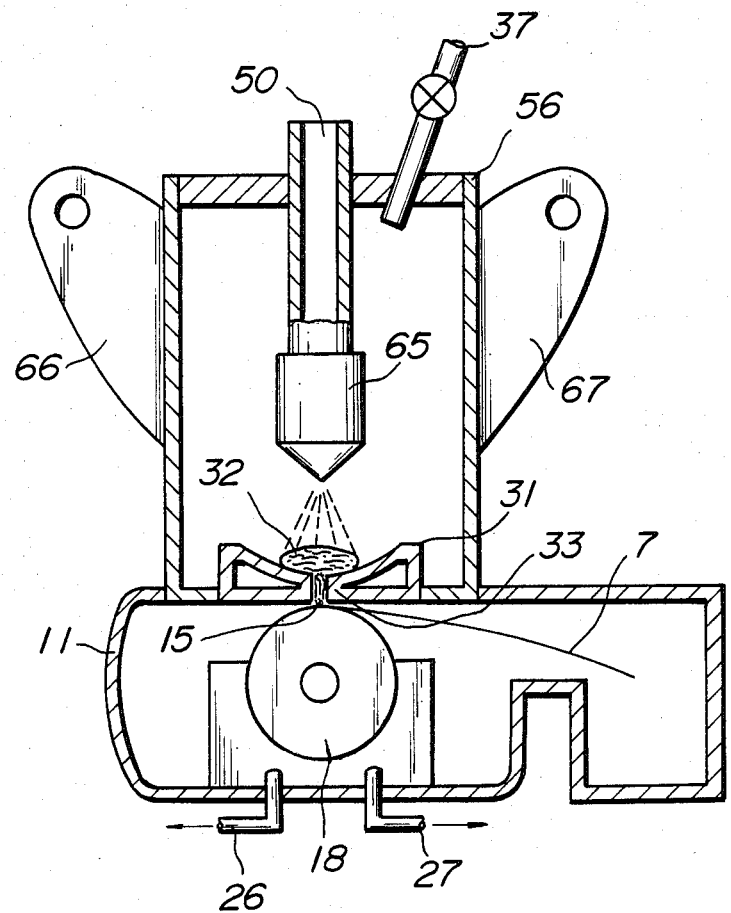
FIG. 16 shows a sectional view of a manufacturing apparatus of thin ribbon according to the present invention by using a burner as a heating means.

In FIG. 16, the material of melt 32 is heated and melted by a gas burner 65. A combustion gas source for said burner 65 may be mixtures of oxygen and hydrogen, acetylene and oxygen, propane and oxygen, etc. A heating flame can be oxidizing, reducing or neutral by adjusting a supply amount of oxygen. It is obvious that said apparatus can be provided an effective means in case the characteristic of said thin ribbon is not deteriorated by the inclusion of carbon.

In FIG. 16, reference numeral 56 which includes reference numerals 66 and 67 is a heat insulating tube, 37 is a gas inlet valve for pressurizing and adjusting atmosphere, and 50 is an inlet of a raw material of melt.

A thin ribbon wafer of composite clad of semiconductor material is also manufactured by the method according to the present invention by multiple nozzle or a single nozzle having multiple-nozzle holes. These and other embodiments will be further explained in detail by FIGS. 17 to 26 and 28 to FIG. 29.

Said thin ribbon wafer of composite clad of semiconductor material is made of semiconductor material of silicon with at least one element of less than 10 atomic %, said silicon selected from the group consisting of non-metallic elements such as hydrogen, phosphorus, sulfur and oxygen; semi-metallic elements such as boron, arsenic, tellurium, tin and selenium; metallic elements such as aluminum, gallium, indium, chromium, silver, iron and bismuth; and mixtures thereof; compound and ceramics. Said ejection of the melt according to the present invention is carried out through multiple holes of a single nozzle or multiple-nozzles arranged on one or more than one line in a lateral direction of the moving substrate, in perpendicular or inclined angle to the moving surface of the cooling substrate, or one or more than one direction parallel to the moving direction of the surface of the cooling substrate.

Said thin ribbon wafer of composite clad of semiconductor may be defined as a thin ribbon that a plurality of thin ribbon wafers are laminated and bonded together with whole or at least a part of said adjacent thin ribbon.

For instance, it is illustrated as a and b which are two kinds of thin ribbon wafers of semiconductor made of two kinds of metals. c and d are two kinds of thin ribbon wafers of semiconductor made of two kinds of ceramics. If a composite clad of thin ribbon wafer of semiconductor is to be manufactured with two or three each individual thin ribbons, the construction can be selected from the following arrangements such as a-b, a-c, a-d, b-c, b-d, a-c-a, a-c-b, b-c-b, c-a-c, c-b-c, d-a-d, d-b-d, c-a-d, c-b-d, etc., as shown in FIG. 17 and FIG. 18.

Figure 19:
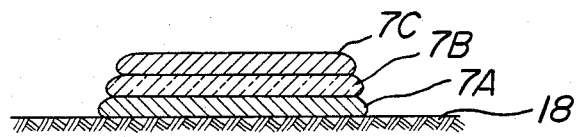

These thin ribbon wafers of composite clad of semiconductor can be laminated and bonded together to form a multiple-layered thin ribbon wafer of semiconductor by repeating said process according to the present invention as shown in FIG. 19.

These embodiments for manufacturing a thin ribbon wafer of composite clad of semiconductor material according to the present invention will be explained in more detail referring to the accompanying drawings of FIGS. 17 to 19.

Figure 17:
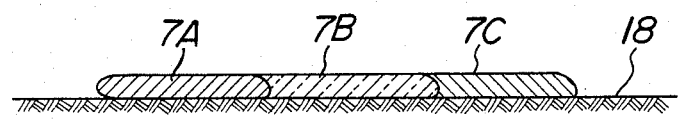
FIG. 17 to FIG. 19 illustrate sectional views of thin ribbon wafers cut in a lateral direction of said thin ribbon wafer of composite clad of semiconductor bonded with each adjacent thin ribbon wafer.
Figure 18:
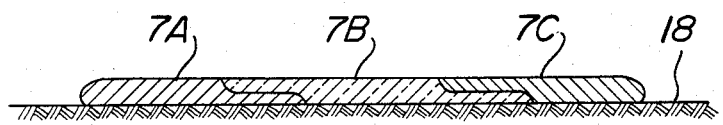

FIGS. 17 to 19 illustrate sectional views of thin ribbon wafers cut in a lateral direction of said thin ribbon wafer of composite clad of semiconductor bonded with each adjacent thin ribbon wafer.

FIG. 17 illustrates a sectional view in longitudinal direction of a thin ribbon wafer of composite clad of semiconductor bonded to each other in each adjacent side portion of three thin ribbon wafers 7A, 7B and 7C, wherein the melts made of three kinds of metallic material was ejected through three nozzle holes aligned perpendicular to the line of the moving direction of the cooling substrate and close to the moving surface of cooling substrate 18, and the jet flow of the melts were super-rapidly cooled and bonded with each other on the side portion of each jet flow of melt as they were solidified on the moving surface of the cooling substrate.

FIG. 18 illustrates a sectional view of a thin ribbon wafer of composite clad of semiconductor laterally and rectangularly cut down to the moving direction of said ribbon wafer, wherein each melt was ejected through each nozzle disposed on an inclined angle with respect to the moving direction, whereby the jet flow of each melt was ejected through said nozzle with some time lag toward the moving surface of the cooling substrate, because of the inclined angle and each was overlapped in adjacent portion and solidified on the moving surface of the cooling substrate. In this case, twin rolls may be used for adjusting the evenness of thickness of the thus obtained thin ribbon wafer, whereby the thus obtained thin ribbon is rolled between twin rolls so as to adjust the constant thickness of thin ribbon wafer after ejecting the melt on the moving surface of the cooling substrate.

FIG. 19 illustrates a sectional view of thin ribbon wafer of laminated composite clad of semiconductor material laterally and rectangularly cut down to the rectangular direction of the moving surface of the laminated thin ribbon wafer 7A, 7B and 7C, wherein each melt was ejected by time lag through each nozzle aligned in parallel on the same line, the first jet flow of melt was ejected downwardly toward the moving surface of the cooling substrate and solidified on said cooling substrate, and the second jet flow of melt was ejected on the solidified surface of said first layer of thin ribbon wafer 7A and solidified, and the third jet flow of melt was ejected on the solidified surface of said second layer of thin ribbon wafer 7B, and the third layer 7C was solidified in a laminated manner layer by layer.

Figure 20:
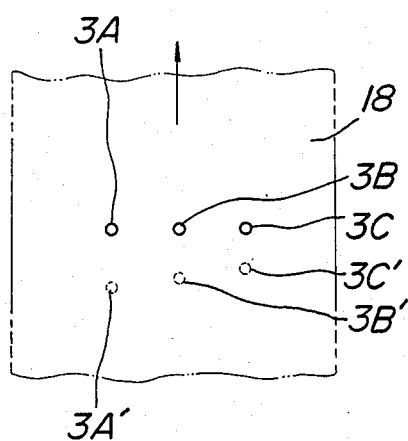
FIG. 20 to FIG. 22 illustrate examples of disposition of nozzle holes against the moving direction of cooling substrate.
Figure 21:
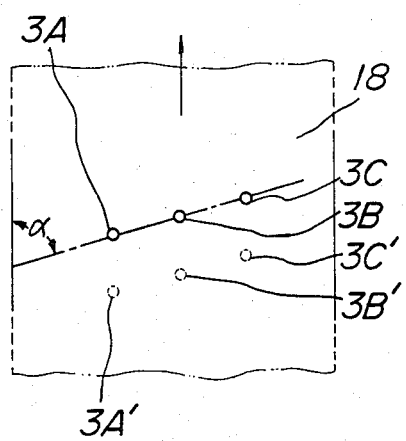
Figure 22:
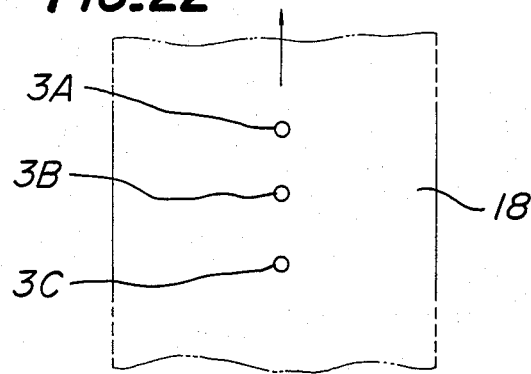

FIGS. 20 to 22 illustrate examples of disposition of nozzle holes against the moving direction of the cooling substrate. FIG. 20 illustrates a diagrammatical plan view of arrangement of nozzle holes which enable production of thin ribbon wafers of composite clad of semiconductor bonded with each other in adjacent side portion of jet flow of melt as shown in FIG. 17, wherein nozzle holes are arranged in one line and laterally spaced to the moving direction of the cooling substrate.

FIG. 21 illustrates a diagrammatical plan view of arrangement of nozzle holes 3A, 3B and 3C which enable production of a thin ribbon wafer of composite clad of semiconductor bonded side by side in an overlapping fashion in adjacent side portions of jet flow of melt as shown in FIG. 18, wherein a plurality of nozzles 3A, 3B and 3C are arranged in an inclined direction at some angle $\alpha$ to the moving direction of the cooling substrate as shown by the arrow so as to laminate the solidified jet flow of melt side by side in whole or in part of the thin ribbon.

FIG. 22 illustrates a diagrammatical plan view of disposition of nozzle holes parallel to the moving direction of the cooling substrate as shown by the arrow which enables to production of a thin ribbon wafer of composite clad of semiconductor bonded to each other in the laminated portion of each layer of thin ribbon wafer as shown in FIG. 19, wherein nozzle holes are arranged in one line parallel to the moving direction of the cooling substrate.

In FIG. 20, dotted nozzle holes 3A', 3B' and 3C' arranged on one line other than that of nozzle holes 3A, 3B and 3C, cause to produce a double layered thin ribbon wafer of composite clad of semiconductor having sufficient width.

In FIG. 21, dotted nozzle holes 3A', 3B' and 3C' arranged on one line parallel to the other of nozzle holes 3A, 3B and 3C also cause to produce a double layered thin ribbon wafer of composite clad of semiconductor having sufficient width.

According to the present invention, the problem will be solved by determining the ejecting direction of at least one jet flow of the melt through nozzle holes toward the moving direction of the cooling substrate or the moving surface of cooling substrate such as the following (a) to (c).

(a) The ejecting direction of jet flow of melt is perpendicular to the moving surface or the moving direction of cooling substrate.

(b) The ejecting direction of jet flow of melt is inclined with some angle $\alpha$ for the moving direction of the moving surface of the cooling substrate shown by the arrow.

(c) The ejecting direction of jet flow of melt is perpendicular to the moving direction of the cooling substrate and inclined with some angle $\alpha$ to the moving surface of the cooling substrate.

FIG. 23 to FIG. 26 illustrate a three-dimensional view showing the relative position between at least one ejecting direction of nozzle hole and at least one moving direction of the cooling substrate.

Figure 23A:
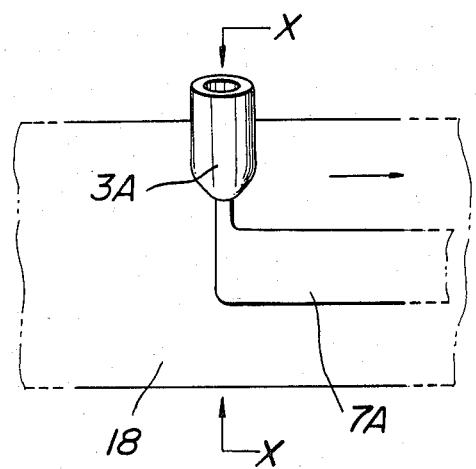
FIG. 23(A) illustrates a plan view showing the relative position between one nozzle hole and the moving surface of cooling substrate.

FIG. 23(A) illustrates a plan view showing the relative position between one nozzle hole 3A and the moving surface of the cooling substrate 18, in which 7a designates a thin ribbon wafer produced by ejecting and solidifying the jet flow of melt toward the moving surface of the cooling substrate. The arrow shows a moving direction of the cooling substrate.

Figure 23B:
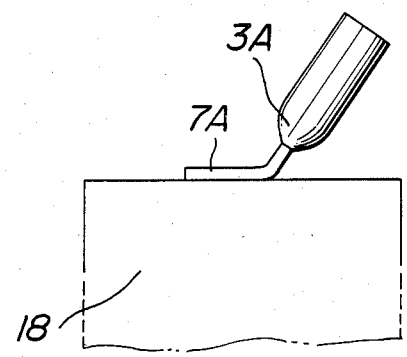
FIG. 23(B) illustrates a vertical cross-sectional view along X—X line of FIG. 23(A)

FIG. 23(B) illustrates a vertical cross-sectional view along X—X line of FIG. 23(A).

Figure 24:
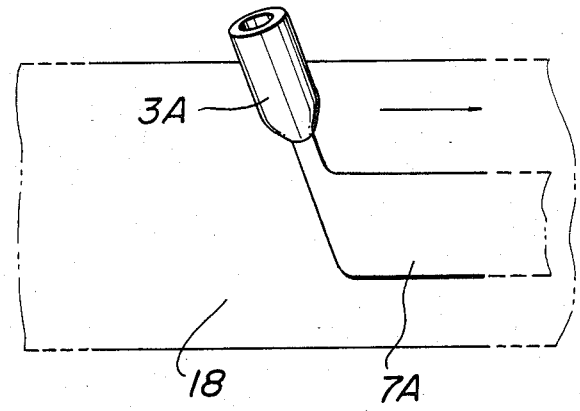
FIG. 24 illustrates a plan view showing the relative position between one nozzle hole and the moving surface of the cooling substrate.

FIG. 24 illustrates a plan view showing the relative position between one nozzle hole 3A and the moving surface of the cooling substrate, in which 7a designates a thin ribbon wafer produced by ejecting and solidifying the jet flow of melt toward the moving surface of the cooling substrate. The arrow shows a moving direction of the cooling substrate.

According to the present invention, the width and thickness of the thin ribbon wafer produced by super-rapid cooling the melt ejected through each nozzle hole can be controlled by determining the relation between the ejecting direction and angles of a plurality of nozzle holes and the direction of the moving surface of the cooling substrate.

Figure 25A:
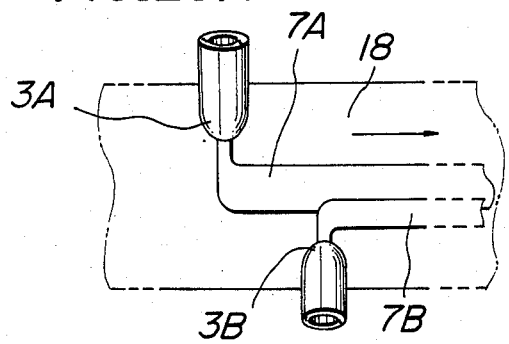
FIG. 25(A) illustrates a plan view showing the relative position between two nozzle holes and the moving surface of cooling substrate.
Figure 25B:
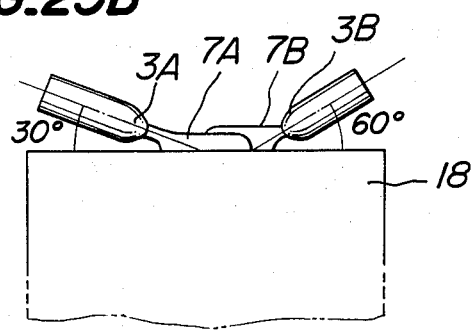
FIG. 25(B) illustrates an elevation of FIG. 25(A)

As shown in the plan view of FIG. 25(A), if the ejecting angle through nozzle 3A against the moving surface of cooling substrate is 30° and the ejecting angle through nozzle 3B against the moving surface of the cooling substrate is 60° and the other conditions are the same, the thin ribbon wafer 7A ejected through nozzle 3A and solidified by super-rapid cooling on said moving surface of cooling substrate is wider than that of the thin ribbon 7B ejected through nozzle 3B and solidified by super-rapid cooling on said moving surface of the cooling substrate 18, and the thickness of the former is thinner than that of the latter. FIG. 25(B) illustrates an elevation view of FIG. 25(A). In FIG. 25(B), numeral 18 designates a moving surface of the cooling substrate, and 7A and 7B are thin ribbon wafers solidified on said moving surface of the cooling substrate after ejecting the melt through each nozzle 3A and 3B.

Figure 26:
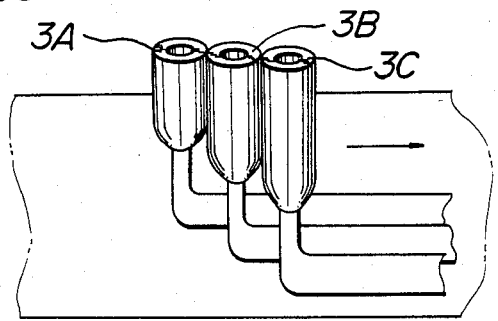
FIG. 26 illustrates a plan view of other embodiment of multi-nozzle arrangement.

FIG. 26 illustrates a three-dimensional view of another embodiment of nozzle arrangement so as to eject the melt through three nozzles 3A, 3B and 3C on the moving surface of cooling substrate 18 parallel with some time difference and with some deviation in lateral direction.

A method of producing a thin ribbon wafer of composite clad of semiconductor by ejecting the melt through two or three nozzles on the moving surface of the cooling substrate and solidified by super-rapid cooling thereon has been explained, while the method of producing thin ribbon wafer through more than four nozzles is carried out by the same manner.

The nozzle material for ejecting the melt may be selected from fused silica, alumina, magnesia, platinum, boron nitride, silicon carbide, silicon nitride, carbon or the like and the water cooled double heat-resisting tube as shown in FIGS. 13 to 16 can be used.

For the selection of nozzle material for ejecting melt, it is preferable to use the material which does not react with the melt physically and does not fuse or react with the melt chemically. For instance, it is not applicable for the nozzle hole made of platinum or platinum-rhodium alloy to the melt of an alloy including carbon and alumina or magnesia is not applicable for the nozzle material for the melt of ceramics, more specially blast furnace slag. It is preferable to use a nozzle hole made by silicon carbide or silicon nitride and alumina or magnesia coated by silicon carbide or silicon nitride.

The material for the cooling substrate is selected from copper, copper alloy such as copper-beryllium and brass, stainless steel, aluminum, chromium steel, hard alloy such as tungally (trade name), heat-resistant steel such as carbon steel, etc., and ceramics such as glass, quartz, silicon and fused alumina. It is also applicable to use a cooling substrate which is cooled by fluid or liquid such as air, water, oil, etc.

According to the present invention, the twin rolls can be used as the cooling substrate and the melt may be ejected to the closest point of said twin rolls so as to produce a thin ribbon wafer.

The use of said twin rolls is more effective in cooling to produce a thin ribbon wafer of composite clad of semiconductor than the use of the single roll.

It is preferable to obtain a thin ribbon wafer having a relatively flat and smooth surface on both sides of the ribbon and the high accuracy in thickness caused by pressing using the twin rolls. In this case, the melt ejected through the nozzle to the moving surface of the cooling substrate should not be completely solidified, but it should still have the sufficient plasticity at the time of reaching the twin rolls for pressing.

In the case of using the twin rolls according to the present invention, if the ejecting direction of nozzles for ejecting the melt is inclined at an angle against the moving surface or the moving direction of the cooling substrate as shown in FIG. 24, a plurality of nozzles can be arranged to the closest contact point of the twin rolls, whereby the non-plastic material, near room temperature, such as ceramics can be formed to form a thin ribbon wafer having an accurate thickness by pressing the melt at a high temperature.

The atmosphere in carrying out the present invention can be selected from vacuum, neutral, oxidizing or reducing atmosphere.

For instance, in producing a thin ribbon wafer of composite clad of semiconductor made of two metal layers, it is preferable to select from a vacuum, neutral or reducing atmosphere so as not to include the oxidized layer into the adhesion portion of the layers.

For instance, in the case of making a thin ribbon wafer of composite clad, made of metal and ceramics, which is not adhesive to each other directly, the melt of metal is ejected onto the moving surface of the cooling substrate in an oxidizing atmosphere and the thus obtained ribbon wafer is coated by metallic oxide layer by oxidizing the whole periphery of the thin ribbon wafer, so the melt of ceramics can be firmly adhered to the oxide layer of metallic thin ribbon wafer by chemical reaction between ceramics and the metallic oxide layer.

According to the present invention, a method of manufacturing a thin ribbon wafer of composite clad by laminating the melt ejected through a plurality of nozzle holes so as to make the composite clad wholly or in part of the thin ribbon wafer, a thin ribbon wafer of composite clad of conductive lead wire can be produced by laminating the electric insulating thin ribbon wafer in the uppermost layer and the lowermost layer.

The present invention will be explained in more detail with reference to the following examples, but it is a matter of course that the present invention is not limited to these examples.

EXAMPLE 1

In a transparent quartz tube having a nozzle at its end, a pure silicon having a purity of $10^{-8}$ was heated to 1,550° C. to form a uniform melt thereof. The melt thus formed was ejected through the nozzle onto a drum made of beryllium copper alloy and having a diameter of 300 mm, said drum being placed in a vacuum of $10^{-8}$ Torr, and rotated at a speed of 2,500 rpm.

FIGS. 27(A) and 27(B) illustrate microscopic photographs of the thus obtained thin ribbon wafer. In the macrographic inspection of FIG. 27(A), a crator recess having a diameter of 50–100 μm has been observed on the lustrous free surface which is located opposite the side of the surface contacted with a roll during the super-rapid cooling. FIG. 27(B) shows the microscopic photograph of the rolled surface, in which shallow grooves having a width of about 10-30 μm running toward the longitudinal direction was observed and the luster is dull. In the microscopic inspection of the cross section of the thin ribbon wafer, it was observed that the column-type crystal structure was grown from the rolled surface to the free surface of the thin ribbon wafer as a result of super-rapid cooling.

Figure 28:
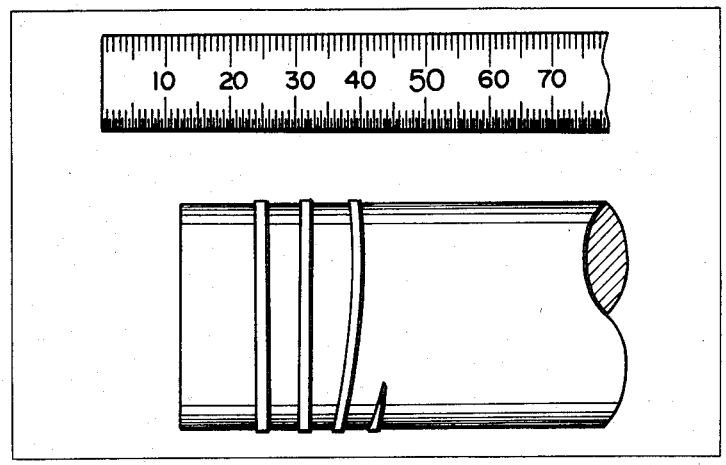
FIG. 28 illustrates an explanatory view showing the flexibility of the thus obtained thin ribbon wafer of silicon semiconductor obtained by super-rapid cooling, in which the thin ribbon wafer can be wound up to the pipe having a diameter of 34 mm without breakage.

A silicon thin ribbon wafer obtained in this example has a typical thickness of 30 μm and a length of 10 cm. A resistivity of the wafer is $10^8 \Omega$-cm and a greater part, i.e. more than 50% by volume is formed by grains having diameters of about 3 to 50 μm. Fine and condensed polycrystalline structure is grown in such a manner that an axis [110] situates within ±40° with respect to a normal to the wafer surface. It should be noted that the thickness of the wafer can be varied within a range of 5-200 μm. The breakdown test for the wafer expressed for bending radii of the wafers having thicknesses of 5 μm, 30 μm and 200 μm are 0.5 cm, 5 cm and 20 cm, respectively. The resulting thin ribbon wafer has a sufficient flexibility so as to be able to wind up on a pipe of 34 mm without breaking as shown in FIG. 28. Such a strength against bending is sufficient for manufacturing actual semiconductor devices. Such a large bending strength can be conceived by the fact that crystal axes of the fine crystalline grains have oriented substantially in the same direction. Such an orientation of the crystal axes is very suitable for electrical properties of the semiconductor thin ribbon wafer, because a property of the crystal surface such as a surface potential density can be determined simply and a recombination probability at a crystal interface is reduced.

EXAMPLE 2

In the transparent quartz tube raw materials consisting of pure silicon having added thereto phosphorus, antimony, boron and tin, respectively by as much amount as can form a solid solution was heated over a melting point. A melt was ejected through the nozzle onto a copper drum rotating at 2,300 rpm. The drum had a diameter of 400 mm and was placed in a vacuum of $10^{-8}$ Torr.

Thin ribbon wafers obtained in this example 2 have substantially the same thickness, length and grain diameter as those of the first example 1. However, the resistivity was reduced as compared with the example 1 to a greater extent. The resistivities and impurity concentrations of the thin ribbon wafers are shown in the following table.

| Added element | Resistivity | Impurity concentration |
|---|---|---|
| P | $10^{-3}$ Ωcm | $10^{18}/cm^3$ |
| Sb | $10^{-2}$ Ωcm | $10^{18}/cm^3$ |
| B | $10^{-2}$ Ωcm | $10^{18}/cm^3$ |
| Sn | — | — |

Figure 29:
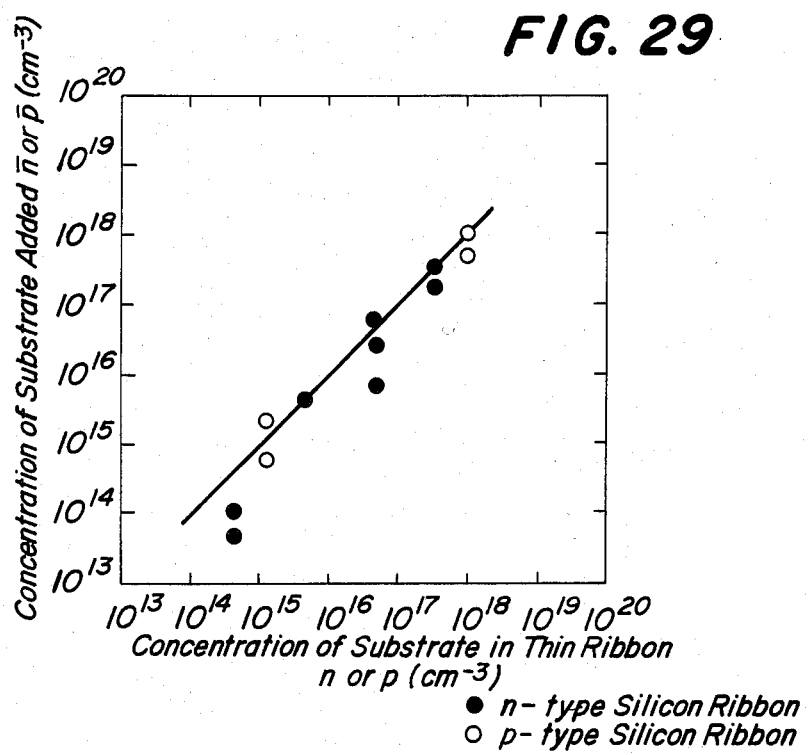
FIG. 29 illustrates the relation between the concentration of additional element of substrate and the concentration of substrate element in the thin ribbon wafer.

FIG. 29 illustrates the relation between the concentration (n̄, p̄) of the additional element of the substrate and the concentration (n, p) of the substrate element in the thin ribbon wafer. As can be seen from FIG. 19, the concentration of the substrate is kept in a suitable range in the thus obtained thin ribbon wafer. In FIG. 29, the blocked out point designates the concentration of the substrate in n-type silicon thin ribbon wafer and the round dot designates the concentration of the substrate in the p-type silicon thin ribbon wafer.

It should be noted that even if tin was added to silicon by 25%, it was possible to form a flexible thin ribbon wafer.

EXAMPLE 3

In the transparent quartz tube pure silicon having added boron thereto was heated to form a melt thereof. The melt was ejected through the nozzle onto a stainless steel drum and a stainless steel endless belt, respectively arranged in the air. The drum has a diameter of 180 mm and was rotated at a speed of 3,000 rpm. The belt travelled at a linear speed of 20 m/sec.

In the present example thin ribbon wafers of p-type conductivity having a width of about 6 mm and a length of several centimeters were obtained. An oxygen distribution in a depth direction was measured by a combination of an ion etching and an Anger's electron spectroscopic method and it was found that below a hundred and several ten Å from the surface of silicon, oxide was observed and in a deeper region an oxide concentration was abruptly decreased. The resistivity of the deeper region was about 0.01Ω-cm. It was found that the wafer has a preferable property for forming semiconductor devices such as a substrate for growing a semiconductor crystal including polycrystal, a thin film wafer, a ribbon, sheet and the other material for semiconductor elements. From a light absorption spectrum measurement, it was further found that the thin ribbon wafer obtained in this example lies in an intermediate state between a single crystal state and an amorphous state.

Figure 30:
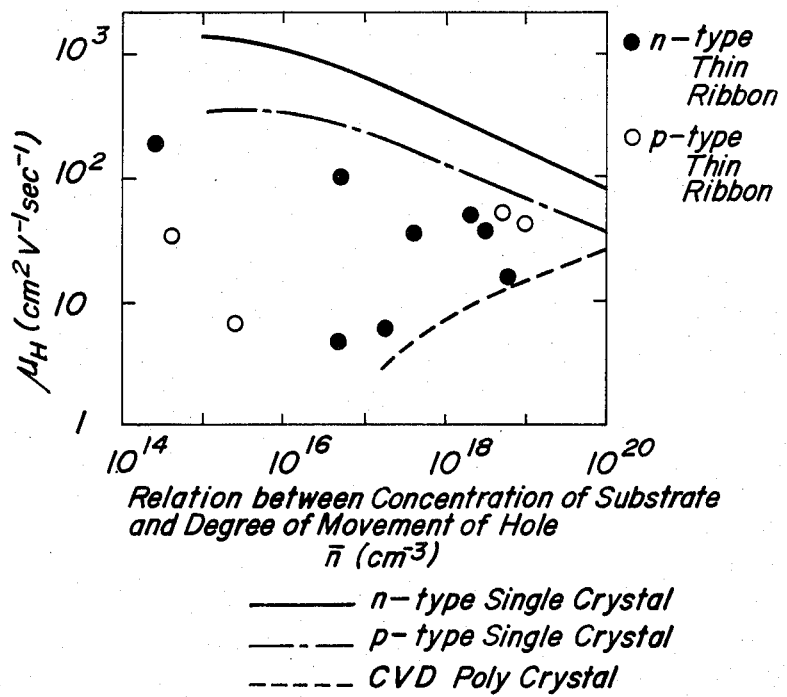
FIG. 30 illustrates the relation between the concentration of substrate and degree of movement of holes.

FIG. 30 illustrates the relation between the concentration of substrate and degree of movement of holes. In FIG. 30, a solid line designates a concentration (n̄) of n-type single crystal, a broken line designates a concentration of p-type single crystal and a small broken line designates a concentration of CVD polycrystal, respectively.

The ordinate designates a degree of movement of hole $\mu_M$ ($cm^2 \cdot V^{-1} \cdot sec^{-1}$).

Figure 31:
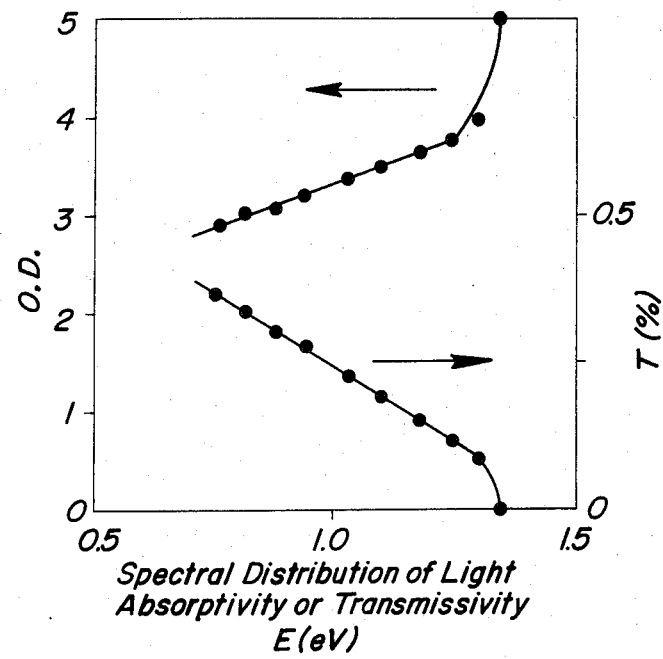
FIG. 31 illustrates the spectral distribution of light absorptivity or transmissivity.

FIG. 31 illustrates the relation between the optical densitometer (O.D.), transmission factor T(%) and energy E(eV) analyzed by the distribution of spectrum.

In FIG. 31, the abscissa designates energy E(eV), the left side ordinate represents optical density (O.D.) and the right side ordinate represents the transmission factor T(%).

That is, as shown in FIGS. 30 and 31, the optical density and transmission factor shows that optical densitometric coefficient has a large value as compared with the single crystal. It is considered that both the geometric structure of the surface and the polycrystallinity contribute. FIG. 30 shows one embodiment of the measurement result of the concentration of dopant and degree of movement of holes. The degree of movement of holes differs from the case of the single crystal and is within the range of 300-100 $cm^2 \cdot V^{-1} sec^{-1}$ apart from the concentration of dopant, and this degree is almost equal to the value of the polycrystal of silicon semiconductor obtained by the CVD method, but is close to the value of the single crystal when the concentration of dopant is $10^{18}$–$10^{19}$ $cm^{-8}$.

EXAMPLE 3

The thin ribbon obtained in Example 3 was heat-treated in vacuum within the temperature range from 500° C. to a melting point of about 1,420° C. for 0.1 second to 1 week.

Mean values of the grain distribution after the heat treatment were 1.1 times at the heat treatment of 500° C. for about one week, 5 times at the heat treatment of 1,100° C. for about 48 hours and 2 times with the heat treatment of the temperature around the melting point for about 0.1 second (during dropping through the tube furnace kept at a temperature of 1,420° C.) as compared with a mean value before the heat treatment.

Further, grain sizes of 5–500 μm in diameter were observed in the thin ribbon after said heat treatment. The electric resistance after the heat treatment was reduced to less than 80% of the original value before heat treatment, and it was observed that some of the single crystal was observed by the light absorption spectrum analysis. It was further observed that grains were almost monocrystallized by the heat treatment at 1,400° C. for about 24 hours.

It was also observed that as the growth of grain size by the heat treatment, a recoupling speed of an electron and a positive hole at the boundary of crystal grain is reduced and the electrical characteristics are greatly improved.

EXAMPLE 5

The melt of boron doped silicon was ejected through a plurality of nozzle holes to a cooling drum made of aluminum having a diameter of 100–600 mm in an argon atmosphere of 10–760 Torr.

In this example, a very long thin ribbon having a width of more than 30 mm was obtained. In the inside portion of more than several ten Å from the surface of the thin ribbon, oxygen was not detected but argon was detected. The electric resistance was 0.01Ω cm as p-type semiconductor.

The thin ribbon of this example was effective as a substrate for growing a wafer of crystal, polycrystal or amorphous for semiconductor elements. That is, a thin ribbon substrate temperature was set at 100°–300° C., a glow discharge is carried out in the atmosphere of $SiH_4$ and a p-type α-silicon layer was grown or an n-type α-silicon layer is further grown thereon, and thereafter a sandwich-shaped electrode of aluminum or indium was deposited on both surfaces and a solar cell of Schottky junction or p-n junction was formed, or on this ribbon substrate was grown an α-silicon or polycrystal silicon layer by vacuum deposition, Sputtering, CVD method or the like, and an electrode of aluminum or the like was deposited in the form of a plane and a solar cell had been formed.

EXAMPLE 6

An aluminum electrode having a thickness of 100 Å was deposited on the thin ribbon obtained in Example 5 by vacuum deposition and a Schottky barrier was formed.

An electric power generated by light was induced on the Schottky barrier against the visible light.

EXAMPLE 7

The thin ribbon obtained in example 5 was heat treated in the vapor of 600° C. for about 30 minutes and a thin oxide film was formed on the surface, and thereafter, an aluminum electrode having a thickness of 100 Å was deposited thereon in vacuum and a metal-oxide-polycrystalline structure of silicon semiconductor was formed.

This structure induces an electric power generated by visible light.

EXAMPLE 8

A thermal oxide film was formed on the surface of the thin ribbon obtained in example 5 in the same manner as in example 7, and thereafter, a gold electrode was deposited thereon by vacuum deposition and a metal-oxide-polycrystalline structure of silicon semiconductor was formed.

This structure shows a non-reversible current-voltage characteristic. This is effective as a memory-switch element.

EXAMPLE 9

The coating such as GaAs, $In_2O_3$ and $SnO_2$ was grown on the surface of the thin ribbon wafer obtained in example 5 by a CVD method.

This structure shows diode characteristics.

EXAMPLE 10

As shown in FIG. 32, two nozzles 3a, 3b were arranged in the opposite direction to the surface of a rotating cooling substrate 18 made of copper having a diameter of 40 cm by mutually maintaining suitable intervals in the peripheral direction and the axial direction, silicon containing n-type impurities and p-type impurities are filled to each of the nozzles 3a, 3b, heated to a melt, and thereafter, the silicon melt was simultaneously ejected onto the rotating surface of cooling substrate 18 rotated at 1,000 rpm with 0.8 atmospheric pressure.

In this example, two kinds of n-type thin ribbon 7A and p-type thin ribbon 7B were composite clad to be integrated and a composite clad of thin ribbon wafer having a p-n junction at the mutual boundary was thus obtained. When the arrangement of the nozzles and the diameter of the ejecting holes were adjusted, there were obtained a composite clad of thin ribbon wafer having the kind of constructions which cross-sections are shown in FIGS. 33(A) to 33(D). Further, if the concentration of impurities was varied, there were formed various junctions such as p-n, $p^+$-$n^+$, $p^+$-n, p-i, and n-i type junction at the boundary of the composite clad of thin ribbon wafer. If a number of nozzles was further increased and the concentration of impurities in each supply through nozzle were periodically varied, a composite clad of thin ribbons wafer having the n-p-$p^+$ type periodically can be obtained in a same structure.

According to this example, since the junction is formed by super-rapid cooling, mutual dispersion is less than the method of CVD, liquid phase epitaxial method or the like, so that the junction having a steep impurity concentration distribution such as $p^+$-$n^+$ type or the like can easily be formed. Further, according to the composite thin ribbon wafer having a periodically n-type, p-type and $p^+$-type aligned side by side structure as shown in FIG. 33(E), a large electric power generated by optical densitometer can be obtained and such composite thin ribbon is very effective as a solar cell.

EXAMPLE 11

On the thin ribbons obtained in examples 1 to 5 metals such as Al, Au, Sb, Ga, In, Pt, Cr, etc. or alloys thereof were successively deposited in the form of multiple layers so as to form an electrode.

An ohmic electrode was obtained by directly depositing argon and chromium or the like on the surface of a thin ribbon. Gold or the like was deposited on chromium having a thickness of about 20 Å as a substrate, and the deposition on the substrate formed the ohmic electrode. The method of this multiple-layer deposition can stably form a thin gold electrode on a thin ribbon wafer and it is effective for making a transparent electrode to visible light or the like.

If the results shown in the above examples are brought together, with the use of the thin ribbon according to the invention, it can be possible to obtain each kind of semiconductor devices having useful large surface areas such as a sunlight alternating current generator device and the like. For instance, in case that the Schottky-barrier type solar cell shown in example 6 or the junction type solar cell shown in example 10 and the semiconductor growth layer shown in example 9 are formed on the same thin ribbon wafer, a direct current-alternating current transformer mainly consisting of a switching-transistor or the like is formed in said semiconductor growth layer, and direct current power generated by the solar cell is transformed into an alternating current, and as a result, a sunlight alternating current generator device having a large surface area, which is preferable for power transmission, can very cheaply be manufactured.

What is claimed is:

1. A method of manufacturing a thin ribbon of semiconductor material, comprising:

preparing a material essentially consisting of silicon of more than 90 atomic % with less than 10 atomic % of at least one additional element, for improving the properties of a semiconductor, said additional elements being selected from the group consisting of phosphorus, sulfur, boron, arsenic, tellurium, tin, selenium, aluminum, gallium, indium, silver, and bismuth; and a mixture thereof;

heating said semiconductor material to a melt;

ejecting said melt through a nozzle under pressure from 0.01 to 1.5 atm. onto a moving surface of a cooling substrate to cool said melt at a cooling rate of $10^3$–$10^{6°}$ C./sec;

forming a thin ribbon from the group consisting of p-type, i-type or n-type semiconductor material; whereby the thus obtained thin ribbon of semiconductor material has a polycrystalline structure composed of more than 50% of a grain having a grain size of more than 5 $\mu$m, a thickness of 5–200 $\mu$m, and a sufficient flexibility such that it is windable on a pipe having a diameter of 34 mm without breaking or cracking.

2. A method of manufacturing a thin ribbon of semiconductor material as defined in claim 1, wherein said heating, ejecting the melt, cooling and forming are carried out in an oxygen lacking atmosphere.

3. A method as defined in claim 1, wherein the raw semiconductor material is heated at a temperature within the range from a melting point of the raw semiconductor material to 300° C. above the melting point.

4. A method as defined in claim 1, wherein the raw semiconductor material is heated at a temperature within the range from a melting point of the raw semiconductor material 300° C. above the melting point.

5. A method as defined in claim 1, wherein the ejection of the melt against the cooling surface is carried out in a reduced pressure including a vacuum.

6. A method as defined in claim 1, wherein the ejection of the melt against the cooling surface is conducted in a reduced inert gas atmosphere.

7. A method as defined in claim 1, wherein the melt is ejected through the nozzle made of material selected from the group consisting of platinum, platinum-rhodium, tungsten, molybdenum, tantalum, alloys thereof, quartz and graphite.

8. A method as defined in claim 1, wherein the nozzle is lined with a member selected from the group consisting of niobium nitride and boron nitride.

9. A method as defined in claim 1, wherein the melt is ejected through the nozzle material selected from the group consisting of boron nitride, silicon nitride, silicon carbide and carbon.

10. A method as defined in claim 1, wherein the melt is ejected against the cooling substrate made of material having a large cooling effect.

11. A method as defined in claim 1, wherein the cooling substrate is made of material selected from the group consisting of copper, copper-beryllium, brass, steel, stainless steel carbon steel, aluminum, titanium alloy, fused silica, fused alumina and quartz.

12. A method as defined in claim 1, wherein the cooling substrate comprises a rotating drum having a smooth inner surface which serves as the cooling substrate.

13. A method as defined in claim 1, wherein the cooling substrate comprises an endless belt conveyor having a smooth outer surface which serves as the cooling substrate.

14. A method as defined in claim 1, wherein the nozzle comprises a single hole having a circular, elliptical or rectangular configuration.

15. A method as defined in claim 1, wherein the nozzle comprises a plurality of multiple nozzle holes having a circular, elliptical or rectangular configuration and said multiple nozzle holes being aligned close to each other in a direction parallel to an axis of the cooling substrate so that a plurality of jet flows of melt can be combined with each other on the surface of cooling substrate.

16. A method as defined in claim 1, wherein the nozzle comprises at least three holes aligned parallel to an axis of the cooling substrate and a width of outer nozzle holes is smaller than that of the intermediate nozzle holes.

17. A method as defined in claim 1, wherein the nozzle comprises a partition wall for separating the adjacent holes is partially removed.

18. A method as defined in claim 1, wherein the nozzle comprises at least two holes aligned close to each other in a direction parallel to the moving direction of the cooling substrate and at least two jet flows of semiconductor and gaseous or molten material including the same semiconductor are simultaneously ejected through the holes so as to form a thin ribbon of multiple-layer type.

19. A method as defined in claim 1, wherein the thin ribbon is heat-treated at a temperature within the range from 500° C. to a melting point for a time of 0.1 second to a week in vacuum or an inert gas atmosphere.

20. A method as defined in claim 1, wherein the thin ribbon of silicon is heat-treated at about 1,100° C. to 1,400° C. for about 48 hours.

21. A method of manufacturing a thin ribbon of semiconductor material, comprising:

preparaing a material essentially consisting of silicon with less than 10 atomic % of an additional element, for improving the properties of a semiconductor, selected from the group consisting of phosphorus, sulfur, boron, arsenic, tellurium, tin, selenium, aluminum, gallium, indium, silver, bismuth, germanium, InSb, GaAs, BP, CdS, ZnSe, ZnTe, PbS, and a mixture thereof;

heating said semiconductor material to a melt;

ejecting said melt through a nozzle lined with boron nitride under a pressure from 0.1 to 1.5 atm. onto a cooling surface of a moving substrate;

cooling the melt at a cooling rate of $10^{3°}$–$10^{6°}$ C./sec;

forming a thin ribbon of semiconductor material by separating said cooled melt from said moving surface of cooling substrate; and heat-treating the thus obtained thin ribbon for more than 0.1 second at 500° to 1,500° C.;

whereby the thus obtained thin ribbon of semiconductor material has a polycrystalline structure composed of more than 50% of a grain having a grain size of more than 5 μm, a thickness of 5–200 μm a sufficient flexibility such that it is windable on a pipe having a diameter of 34 mm without breaking or cracking and is from the group consisting of p-type, i-type and n-type semiconductor material.

22. A method of manufacturing a thin ribbon of semiconductor material as defined in claim 21, wherein said heating, ejecting, cooling and forming are carried out in an oxygen-lacking atmosphere.

23. A method of manufacturing a thin ribbon of composite clad of semiconductor material selected from silicon with at least one additional element, for improving semiconductor properties, said element being less than 10 atomic % of at least one element selected from the group consisting of phosphorus, sulfur, boron, arsenic, tellurium, tin, selenium, aluminium, gallium, indium, silver, and bismuth; and mixtures thereof wherein said method comprises the steps of:

melting semiconductor material to form a melt;

ejecting the melt through multiple holes of a single nozzle or several holes of multiple nozzles onto the moving surface of a cooling substrate comprising the peripheral surface of a vertical drum, super-rapid cooling the melt on said moving surface of cooling substrate and forming a thin ribbon of semiconductor material having a flexibility such that it is windable on a pipe having a thickness of 5 to 200 μm, wherein said composite clad is composed of at least two layers of two different types of semiconductor material selected from the group consisting of p-type, i-type and n-type semiconductor material.

24. A method of manufacturing a thin ribbon of composite clad of semiconductor material as defined in claim 23, wherein the cooling substrate is a rotating drum having a smooth peripheral surface which serves as the cooling substrate.

25. A method of manufacturing a thin ribbon of composite clad of semiconductor material as defined in claim 23, wherein the nozzle comprises a plurality of holes aligned to each other in a direction perpendicular to the moving direction of the cooling substrate and the end portions of the thin ribbon wafer adjacent to the holes in the longitudinal direction are adhered to each other.

26. A method of manufacturing a thin ribbon of composite clad of semiconductor material as defined in claim 23, wherein a plurality of nozzles are aligned on a plane having a certain angle to the moving direction of the cooling substrate and parts of the thin ribbon adjacent to each other are superimposed one upon the other.

27. A method of manufacturing a thin ribbon of composite clad of semiconductor material as defined in claim 23, wherein a plurality of nozzles are aligned in a direction parallel to the moving direction of the cooling substrate.

28. A method of manufacturing a thin ribbon of composite clad of semiconductor material as defined in claim 23, wherein at least one ejecting direction of the melts ejected from a plurality of nozzles is different from the other ejecting directions of the remaining melts at an angle to the cooling surface of the cooling substrate.

29. A method of manufacturing a thin ribbon of composite clad of semiconductor material selected from silicon with less than 10 atomic % of at least one additional element for improving semiconductor properties selected from the group consisting of phosphorus, sulfur, boron, arsenic, tellurium, tin, selenium, aluminum, gallium, indium, silver, and bismuth; and a mixture thereof, wherein said method comprises the steps of:

melting said semiconductor material to form a melt;

ejecting the melt through multiple holes of a single nozzle or several holes of multiple nozzles onto the surface of a cooling substrate;

cooling the melt super-rapidly on said moving surface cooling substrate to form a thin ribbon of semiconductor material having a flexibility such that it is windable on a pipe having a diameter of 34 mm without cracking or breaking and having a thickness of 5 to 200 μm, wherein said composite clad is composed of at least two layers of at least two different types of semiconductor material selected from the group consisting of p-type, i-type and n-type semiconductor material; and heat treating the thus obtained thin ribbon for more than 0.1 second at 500° to 1500° C.

* * * * *